United States Patent
Wu et al.

(10) Patent No.: US 10,629,552 B2
(45) Date of Patent: Apr. 21, 2020

(54) AMPLIFIERS AND AMPLIFIER MODULES WITH GROUND PLANE HEIGHT VARIATION STRUCTURES

(71) Applicant: NXP USA, Inc., Austin, TX (US)

(72) Inventors: Yu-Ting David Wu, Schaumburg, IL (US); Enver Krvavac, Kildeer, IL (US); Jeffrey Kevin Jones, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/967,102

(22) Filed: Apr. 30, 2018

(65) Prior Publication Data

US 2019/0333878 A1    Oct. 31, 2019

(51) Int. Cl.
     *H03F 3/14*      (2006.01)
     *H01L 23/66*      (2006.01)
     (Continued)

(52) U.S. Cl.
     CPC .............. *H01L 23/66* (2013.01); *H01L 23/13* (2013.01); *H01L 23/5383* (2013.01); *H01L 23/5384* (2013.01); *H01L 23/5386* (2013.01); *H01L 24/48* (2013.01); *H01L 25/072* (2013.01); *H03F 1/0288* (2013.01); *H03F 3/19* (2013.01); *H03F 3/211* (2013.01); *H01L 21/4857* (2013.01); *H01L 24/85* (2013.01); *H01L 25/50* (2013.01); *H01L 2223/6611* (2013.01); *H01L 2223/6616* (2013.01); *H01L 2223/6627* (2013.01);
     (Continued)

(58) Field of Classification Search
     CPC ....... H01L 23/66; H01L 25/072; H01L 23/13; H01L 23/5386; H01L 23/5384; H01L 23/5383; H01L 24/48; H03F 1/0288; H03F 3/211; H03F 3/19
     USPC .............................. 330/295, 124 R, 302–306
See application file for complete search history.

(56) References Cited

U.S. PATENT DOCUMENTS 9,571,044 B1 *   2/2017   Zhu ......................... H03F 1/565
9,621,115 B1      4/2017   Wu
     (Continued)

OTHER PUBLICATIONS

Moronval, X et al. "A 100 W multi-band four-way integrated Doherty amplifier", IEEE MTT-S International Microwave Symposium (IMS), San Francisco, CA, pp. 1-3 (May 2016).

*Primary Examiner* — Khanh V Nguyen
*Assistant Examiner* — Khiem D Nguyen
(74) *Attorney, Agent, or Firm* — Sherry W. Schumm

(57) ABSTRACT

An embodiment of a module (e.g., an amplifier module) includes a substrate, a transmission line, and a ground plane height variation structure. The substrate is formed from a plurality of dielectric material layers, and has a mounting surface and a second surface opposite the mounting surface. A plurality of non-overlapping zones is defined at the mounting surface. The transmission line is coupled to the substrate and is located within a first zone of the plurality of non-overlapping zones. The ground plane height variation structure extends from the second surface into the substrate within the first zone. The ground plane height variation structure underlies the transmission line, a portion of the substrate is present between the upper boundary and the transmission line, and the ground plane height variation structure includes a conductive path between an upper boundary of the ground plane height variation structure and the second surface.

21 Claims, 7 Drawing Sheets

(51) Int. Cl.
*H01L 23/13* (2006.01)
*H01L 23/538* (2006.01)
*H01L 23/00* (2006.01)
*H01L 25/07* (2006.01)
*H03F 1/02* (2006.01)
*H03F 3/19* (2006.01)
*H03F 3/21* (2006.01)
H01L 21/48 (2006.01)
H01L 25/00 (2006.01)
H03F 1/07 (2006.01)

(52) U.S. Cl.
CPC .......... *H01L 2223/6655* (2013.01); *H01L 2224/48091* (2013.01); *H01L 2224/48106* (2013.01); *H01L 2224/48227* (2013.01); *H01L 2924/19031* (2013.01); *H01L 2924/30111* (2013.01); *H03F 1/07* (2013.01); *H03F 2200/255* (2013.01); *H03F 2200/423* (2013.01); *H03F 2200/451* (2013.01)

(56) References Cited

U.S. PATENT DOCUMENTS

| | | |
|---|---|---|
| 9,774,301 B1 | 9/2017 | Maalouf et al. |
| 2016/0126905 A1 | 5/2016 | Zhao et al. |

\* cited by examiner

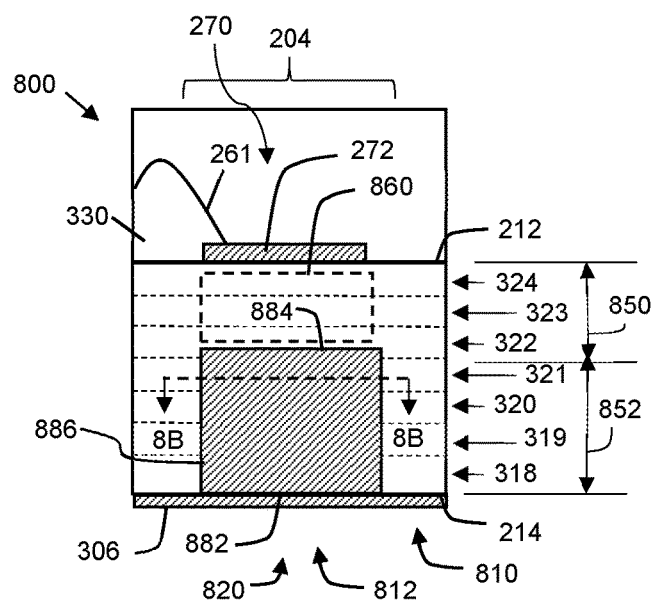
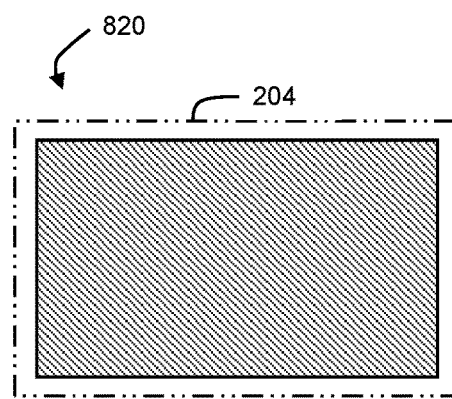
FIG. 8A  FIG. 8B
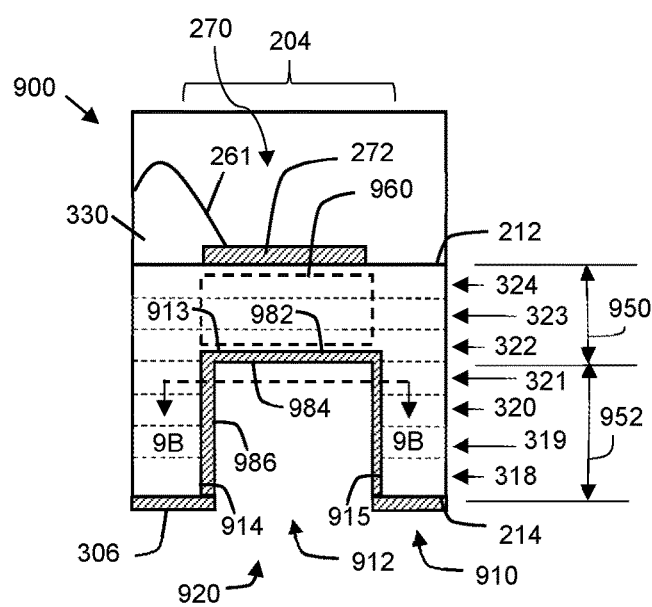
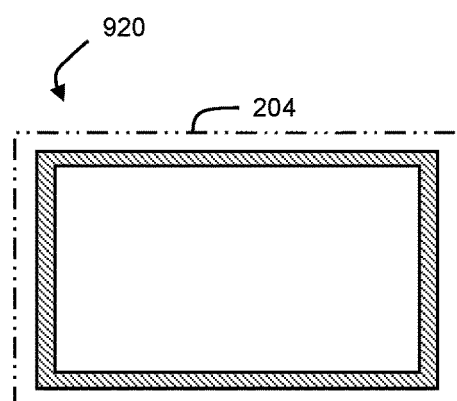
FIG. 9A  FIG. 9B

US 10,629,552 B2

1

AMPLIFIERS AND AMPLIFIER MODULES WITH GROUND PLANE HEIGHT VARIATION STRUCTURES

TECHNICAL FIELD

Embodiments of the subject matter described herein relate generally to radio frequency (RF) amplifiers, and more particularly to Doherty amplifiers and Doherty amplifier modules.

BACKGROUND

Wireless communication systems employ power amplifiers for increasing the power of radio frequency (RF) signals. The power amplifier forms a portion of the last amplification stage in a transmission chain before provision of the amplified signal to an antenna for radiation over the air interface. High gain, high linearity, stability, and a high level of power-added efficiency are characteristics of a desirable amplifier in such a wireless communication system.

In general, a power amplifier operates at maximum power efficiency when the power amplifier transmits close to saturated power. However, power efficiency tends to worsen as output power decreases. Recently, the Doherty amplifier architecture has been the focus of attention not only for base stations but also for mobile terminals because of the architecture's high power-added efficiency over a wide power dynamic range.

A typical two-way Doherty amplifier implementation includes an RF signal splitter configured to divide an input RF signal into two signals (referred to below as a carrier signal and a peaking signal). The amplifier also includes parallel carrier and peaking amplifier paths configured to amplify the carrier and peaking signals, respectively, and a signal combining node at which the amplified carrier and peaking signals are combined, in phase, for provision to an output of the Doherty amplifier. In addition, various phase shift and impedance inversion elements are disposed along the carrier and peaking amplifier paths. For example, in a typical non-inverted Doherty amplifier architecture, a 90-degree phase shift is applied to the peaking signal prior to amplification along the peaking amplifier path. A corresponding 90-degree phase shift and impedance inversion is applied to the carrier signal after amplification along the carrier amplifier path, and before the amplified carrier and peaking signals are combined together in phase at the signal combining node. Such a configuration may be referred to as a "90/0" Doherty amplifier, because about 90 degrees of phase shift is applied to the amplified carrier signal between the drain of the carrier amplifier and the combining node, whereas no substantial phase shift is applied to the amplified peaking signal before it reaches the combining node.

In the design of a 90/0 Doherty amplifier, where the phase from the carrier and peaking device to the Doherty combining node is 90 and 0 degrees respectively, the characteristic impedance of the transmission line that connects the two devices is dictated by the device peripheries and the peaking to carrier ratio. In other words, the characteristic impedance is strictly fixed for a given power level and device ratio.

This creates a significant design challenge when it is desirable to produce modularized Doherty amplifiers that are designed to operate at different power levels, but that fit within a same compact footprint. Namely, for different power levels, such as 2 watt (W), 3 W or 5 W average power Doherty designs, the physical width of the transmission line that connects the two devices can vary widely due to the required different characteristic impedance for each power level. Especially for higher power level designs, it may be difficult or impossible to fit the transmission line into the space originally allocated for lower power level designs.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

FIG. 8, including FIGS. 8A and 8B, include a partial cross-sectional, side view of a portion of another embodiment of the module of FIG. 2 along line X-X, and a cross-sectional, top view of a bulk conductive feature in the impedance inverter zone of FIG. 8A along line 8B-8B, in accordance with yet another example embodiment;

FIG. 9, including FIGS. 9A and 9B, include a partial cross-sectional, side view of a portion of yet another embodiment of the module of FIG. 2 along line X-X, and a cross-sectional, top view of a hollow conductive feature in the impedance inverter zone of FIG. 9A along line 9B-9B, in accordance with yet another example embodiment.

DETAILED DESCRIPTION

Figure 1:
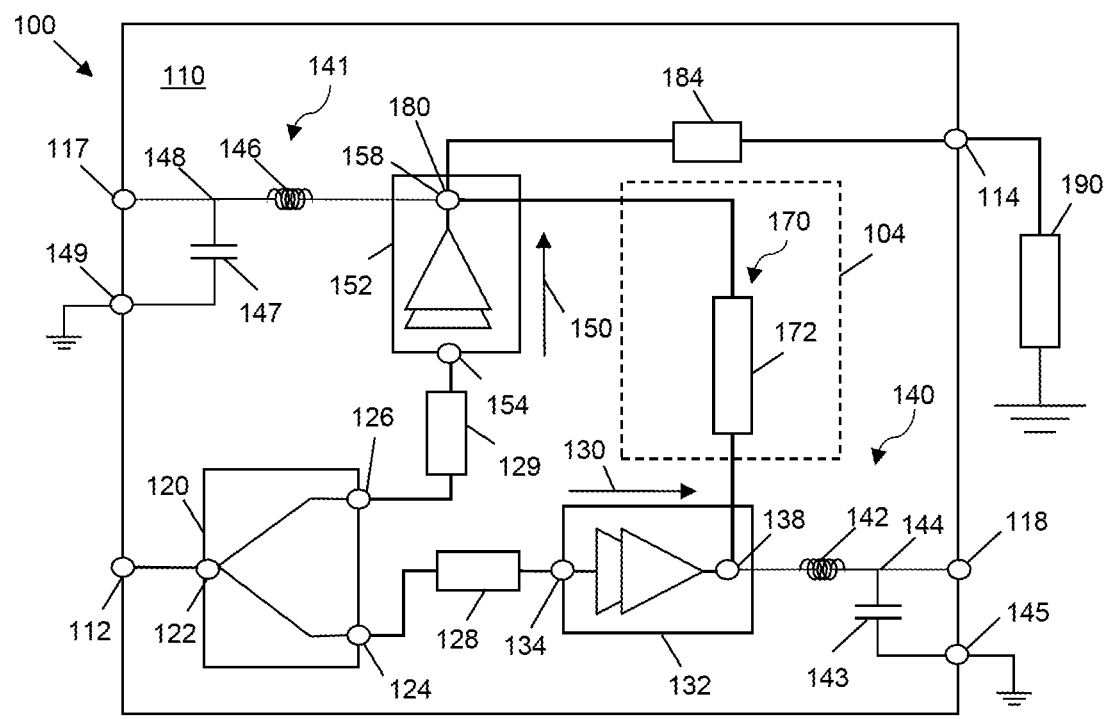
FIG. 1 is a schematic diagram of a Doherty amplifier, in accordance with an example embodiment.

Embodiments of Doherty amplifiers and Doherty amplifier modules described herein include a carrier amplifier, a peaking amplifier, and a plurality of transmission lines coupled to the carrier and peaking amplifiers. For example, one of these transmission lines includes a transmission line interconnecting the outputs of the carrier and peaking amplifier devices (referred to below as the "inverter line"), and another one of these transmission lines includes the transmission line interconnecting the output of the combining node to the module output (referred to below as the "output line"). The carrier and peaking amplifiers and the various transmission lines are coupled to a top surface of a module substrate, in an embodiment. In cross-section, the module substrate includes a plurality of conductive layers interleaved with a plurality of dielectric material layers that define a total thickness of the module substrate between its top and bottom surfaces. A primary ground plane for the system (referred to below as the "system ground plane") is provided at the bottom surface of the substrate, typically at the surface of the printed circuit board (PCB) to which the module substrate is connected. Thus, the thickness of the module substrate generally defines the distance between the transmission lines and the primary system ground plane.

As discussed previously, in conventional Doherty amplifier module designs for different power levels (e.g., 2 watt (W), 3 W or 5 W average power Doherty designs), the physical width of the inverter line may vary widely due to a required different characteristic impedance for each power level. More specifically, for a given characteristic impedance, the physical width of the inverter line is determined by the dielectric constant of the substrate and the distance through the substrate between the inverter line and the primary system ground plane.

A module substrate for a Doherty amplifier module desirably has a specific footprint (e.g., width and length), which fits within a specified "socket" of a system into which the amplifier is incorporated. Given a desire to enable Doherty amplifier modules of various power levels to fit within the same socket, the footprint of Doherty amplifier modules for multiple different power levels desirably should be the same. However, for higher-power modules designed using conventional techniques, the physical line width of an inverter line may be too wide to fit into a pre-defined area allocated for the inverter line for a module substrate previously-designed for a lower-power Doherty amplifier. Accordingly, techniques for incorporating such an inverter line into a Doherty amplifier module may include either increasing the allocated area for the inverter line or thinning the entire module substrate to decrease the distance between the inverter line and the system ground plane.

Increasing the allocated area for the inverter line is undesirable, in many cases, as it may either require the entire module substrate to be enlarged, thus requiring the socket to be modified, or may require other portions of the Doherty circuit to be further compacted, which may be untenable. Thinning the entire module substrate also may be undesirable, as the designs of other portions of the Doherty circuit may be undesirably affected by such thinning. For example, with a thinner module substrate, the width of the output line between the signal combining node and the output of the Doherty amplifier module would need to be decreased, compared with a width associated with a thicker module substrate, in order to maintain a desired impedance (e.g., 50 ohms). However, if the width of the output line is too narrow, this may unduly limit the current-carrying capability of the output line. Other portions of the Doherty amplifier also may be undesirably affected by thinning the entire module substrate.

To overcome these challenges, embodiments of the inventive subject matter include a Doherty amplifier module with a multi-layer substrate that includes a ground plane height variation structure underneath the inverter line. The ground plane height variation structure effectively decreases the distance, through the substrate, between the inverter line and the system ground plane, while maintaining other distances (e.g., the full distance), through the substrate, between other portions of the Doherty amplifier and the system ground plane. This approach enables the substrate underneath the inverter line to be "effectively" thinned to any of various heights, thus enabling inverter lines of similar widths to be utilized for Doherty amplifier modules designed for different power levels. In other words, for a fixed module substrate thickness, various embodiments of ground plane height variation structures may be utilized to produce impedance inverter lines of similar widths but substantially different characteristic impedances. Accordingly, the approach enables inverter lines for Doherty amplifiers designed for different power levels to have the same or a similar physical configuration, and thus to fit within the same area. This, in turn, enables module substrates for various power level Doherty amplifier modules to have the same footprint, thus facilitating incorporation of modules designed for different power levels into a given socket.

FIG. 1 is a schematic diagram of a Doherty amplifier 100, in accordance with an example embodiment. As indicated in FIG. 1 with box 110, some or all components of Doherty amplifier 100 may be implemented in a single device package or module. As will be explained in detail later, and in accordance with various embodiments, the configurations and orientations of the various amplifier components, and the configuration of the substrate to which those components are coupled, enable the size of the package or module to be very compact, when compared with conventional packaging techniques using conventional components and substrates. In addition, usage of the various embodiments enables a compact package or module footprint to be maintained for various power level Doherty amplifier modules, thus facilitating incorporation of multiple different power-level modules into a given socket. These benefits may be realized while still meeting gain, linearity, stability, and efficiency performance criteria. As will be described in more detail later, the various Doherty amplifier packages and modules utilize a specially-configured substrate (e.g., substrate 410, 510, 810, 910, FIGS. 4, 5, 8A, 9A) that includes a ground plane height variation structure (e.g., structure 420, 520, 720, 820, 920, FIGS. 4-7, 8A, 9A) located in an area (or zone) 104 (e.g., zone 204, FIG. 2) of the Doherty amplifier substrate that includes the inverter line 172 (e.g., inverter line 272, FIGS. 2-5, 8A, 9A).

Doherty amplifier 100 includes an RF input node 112, an RF output node 114, a power splitter 120, a carrier amplifier path 130, a peaking amplifier path 150, a phase delay and impedance inversion structure 170 (including inverter line 172), and a signal combining node 180, in an embodiment. In addition, first and second shunt inductance circuits 140, 141 (e.g., each including a shunt inductance 142, 146 and a shunt capacitance 143, 147) may be coupled to the carrier and peaking amplifier paths 130, 150 to enable design flexibility in the physical and electrical length of the inverter line 172.

When incorporated into a larger RF system, the RF input node 112 is coupled to an RF signal source (not illustrated), and the RF output node 114 is coupled to a load 190 (e.g., an antenna or other load). The RF signal source and the load 190 may, in turn, be coupled to or electrically accessible through a system substrate (not shown), which also may provide a ground plane for the amplifier 100 (referred to herein as a "system ground plane"). The RF signal source provides an input RF signal, which is an analog signal that includes spectral energy that typically is centered around one or more carrier frequencies. Fundamentally, the Doherty amplifier 100 is configured to amplify the input RF signal, and to produce an amplified RF signal at the RF output node 114.

The power splitter 120 has an input 122 and two outputs 124, 126, in an embodiment. The power splitter input 122 is coupled to the RF input node 112 to receive the input RF signal. The power splitter 120 is configured to divide the RF input signal received at input 122 into first and second RF signals (or carrier and peaking signals), which are provided to the carrier and peaking amplifier paths 130, 150 through outputs 124, 126. According to an embodiment, the power splitter 120 includes one or more phase shift elements, which is/are configured to impart one or more phase shifts to the carrier signal and/or peaking signal before they are provided to outputs 124, 126. More specifically, the one or more phase shifts are configured so that, at outputs 124 and 126, the carrier and peaking signals may be about 90 degrees out of phase from each other.

When Doherty amplifier 100 has a symmetrical configuration (i.e., a configuration in which the carrier and peaking amplifier power transistors are substantially identical in size), the power splitter 120 may divide or split the input RF signal received at the input 122 into two signals that are very similar with, in some embodiments, equal power. Conversely, when Doherty amplifier 100 has an asymmetrical configuration (i.e., a configuration in which one of the amplifier power transistors, typically the peaking amplifier transistor, is significantly larger), the power splitter 120 may output signals having unequal power.

In some embodiments, the power splitter 120 may be implemented with fixed-value, passive components. In other embodiments, the power splitter 120 may be implemented with one or more controllable variable attenuators and/or variable phase shifters, which enable the power splitter 120 to attenuate and/or phase shift the carrier and peaking signals based on externally-provided control signals.

The outputs 124, 126 of the power splitter 120 are connected to the carrier and peaking amplifier paths 130, 150, respectively. The carrier amplifier path 130 is configured to amplify the carrier signal from the power splitter 120, and to provide the amplified carrier signal to the power combining node 180. Similarly, the peaking amplifier path 150 is configured to amplify the peaking signal from the power splitter 120, and to provide the amplified peaking signal to the power combining node 180. The carrier and peaking paths 130, 150 are designed so that the amplified carrier and peaking signals arrive in phase with each other at the power combining node 180.

The carrier amplifier and the peaking amplifier each may be implemented using a single-stage or multiple-stage power transistor. Using nomenclature typically applied to field effect transistors (FETs), the carrier amplifier transistor and the peaking amplifier transistor each may include a control terminal (e.g., a gate) configured to receive an input RF signal, and two current conducting terminals (e.g., a drain terminal and a source terminal). In some configurations, each source terminal is coupled to a ground reference node, and the amplified carrier and peaking signals are provided at the drain terminals of the carrier amplifier transistor and the peaking amplifier transistor, respectively. In some embodiments, the drain terminal of the peaking amplifier may serve as the combining node 180 for the amplified RF signals produced by the carrier and peaking amplifiers.

According to an embodiment, the carrier amplifier path 130 includes an input circuit 128 (e.g., including an impedance matching circuit), a carrier amplifier die 132, and a phase shift and impedance inversion structure 170 that includes inverter line 172. In addition, and according to an embodiment, the carrier amplifier path 130 includes a first shunt inductance circuit 140 coupled between the output of the carrier amplifier die 132 (e.g., the drain terminal 238 of transistor 237, FIGS. 2, 3) and a terminal 145 configured for coupling with a ground reference voltage.

The carrier amplifier die 132 includes an RF input terminal 134, an RF output terminal 138, and one or more amplification stages coupled between the input and output terminals 134, 138, in various embodiments. The RF input terminal 134 is coupled through input circuit 128 to the first output 124 of the power splitter 120, and thus the RF input terminal 134 receives the carrier signal produced by the power splitter 120.

Each amplification stage of the carrier amplifier die 132 includes a power transistor. More specifically, each power transistor includes a control terminal (e.g., a gate terminal) and first and second current-carrying terminals (e.g., a drain terminal and a source terminal). In a single-stage device, which includes a single power transistor, the control terminal is electrically connected to the RF input terminal 134, one of the current-carrying terminals (e.g., the drain terminal or the source terminal) is electrically connected to the RF output terminal 138, and the other current-carrying terminal (e.g., the source terminal or the drain terminal) is electrically connected to a ground reference (or another voltage reference). Conversely, a two-stage device includes two power transistors coupled in series, where a first transistor functions as a driver amplifier transistor that has a relatively low gain, and a second transistor functions as a final-stage amplifier transistor that has a relatively high gain. In such an embodiment, the control terminal of the driver amplifier transistor is electrically connected to the RF input terminal 134, one of the current-carrying terminals of the driver amplifier transistor (e.g., the drain terminal or the source terminal) is electrically connected to the control terminal of the final-stage amplifier transistor, and the other current-carrying terminal of the driver amplifier transistor (e.g., the source terminal or the drain terminal) is electrically connected to the ground reference (or another voltage reference). Additionally, one of the current-carrying terminals of the final-stage amplifier transistor (e.g., the drain terminal or the source terminal) is electrically connected to the RF output terminal 138, and the other current-carrying terminal of the final-stage amplifier transistor (e.g., the source terminal or the drain terminal) is electrically connected to the ground reference (or another voltage reference).

In addition to the power transistor(s), portions of input and output impedance matching networks and bias circuitry (not illustrated in FIG. 1) also may be monolithically formed as portions of the carrier amplifier die 132 and/or electrically coupled to the carrier amplifier die 132. Further, in an embodiment in which the carrier amplifier die 132 is a two-stage device, an interstage matching network (not illustrated in FIG. 1) also may be monolithically formed as a portion of the carrier amplifier die 132.

The RF output terminal 138 of the carrier amplifier die 132 is coupled to a first shunt inductance circuit 140. The first shunt inductance circuit 140 includes a shunt inductance 142 coupled in series with a shunt capacitance 143 (e.g., a DC blocking capacitor). For example, the first shunt inductance circuit 140 may be configured so that an RF "cold point" is present at the node 144 between shunt inductor 142 and shunt capacitor 143. Accordingly, node 144 may be referred to herein as an "RF cold point node." More specifically, the capacitance of the shunt capacitor 143 is chosen to provide a virtual ground reference voltage for the RF electrical signals at node 144, such that inductive element 142 functions as a shunt inductance to the RF ground voltage. In addition, the RF cold point node 144 is coupled to a drain bias voltage terminal 118, which may be coupled to a bias circuit for providing a DC drain bias voltage to the output (e.g., drain) of the final-stage amplifier of the carrier amplifier die 132. The series combination of inductive element 142 and capacitor 143 may be configured to at least partially resonate out the effects of the parasitic drain-source capacitance, Cds, of the final-stage transistor of the carrier amplifier die 132.

The RF output terminal 138 of the carrier amplifier die 132 is coupled to the signal combining node 180 through phase shift and impedance inversion structure 170 in an embodiment. According to an embodiment, the phase shift and impedance inversion structure 170 includes a transmission line phase shift element 172 (e.g., a microstrip line referred to herein as an "inverter line", such as inverter line inverter line 272, FIGS. 2-5, 8A, 9A), and various die-to-inverter-line interconnections (e.g., wirebond arrays 261, 263, FIGS. 2-5, 8A, 9A) between the inverter line and the carrier and peaking amplifier dies 132, 152. The combination of the inverter line 172, the die-to-inverter-line interconnections, the die bond pads at the outputs of the carrier and peaking dies 132, 152, and other internal structures at the outputs of the dies 132, 152 results in the application of an impedance inversion and about a 90-degree relative phase shift to the carrier signal between the carrier amplifier die 132 and the combining node 180. Conceptually, a first end of the phase shift and impedance inversion structure 170 is coupled to the RF output terminal 138 of the carrier amplifier die 132, and a second end of the phase shift and impedance inversion structure 170 is coupled to the power combining node 180.

It should be noted that, in a practical circuit implementation, the electrical length of a phase shift and impedance inversion structure (e.g., phase shift and impedance inversion structures 170, FIG. 1) is a fixed value that may be desirably less than 90 degrees, such as a value in a range of about 30 degrees to about 70 degrees. At higher frequencies, this fixed electrical length may translate into a very short physical length that is difficult to realize with a phase shift and impedance inversion structure that is implemented, in part, with a printed conductor on a substrate. This is particularly true when the dielectric constant of the substrate is high, which may be the case for a typical printed circuit board (PCB) type of substrate (e.g., substrate 310, 310', 310", FIG. 3). Implementation shunt inductance circuits (e.g., circuits 140, 141, 240, 241, FIGS. 1, 2) coupled to the carrier and/or peaking devices may overcome this issue by enabling an increase in the electrical and physical lengths of the phase shift and impedance inversion structure that electrically connects the devices. This makes the practical circuit implementation more physically realizable and tunable, especially at relatively high frequencies.

As will be explained in more detail in conjunction with FIG. 2, an embodiment of the RF output terminal 138 of the carrier amplifier die 132 is configured to enable the phase shift and impedance inversion structure 170 to extend (e.g., through a wirebond array) in a direction that is angularly offset from (e.g., perpendicular to) the direction of the RF signal through the carrier amplifier die 132 (e.g., as indicated with arrow 130). This may be accomplished, for example, by providing a portion of the output terminal 138 (e.g., drain terminal), which is elongated in a direction that is parallel with the direction of the RF signal through the carrier amplifier die 132, where the first end of the phase shift and impedance inversion structure 170 is connected to the elongated portion of the output terminal 138.

Reference is now made to the peaking amplifier path 150, which includes a peaking amplifier die 152 and an input circuit 129 (e.g., including an impedance matching circuit), in an embodiment. In addition, and according to an embodiment, the peaking amplifier path 150 includes a second shunt inductance circuit 141 coupled between the output 158 of the peaking amplifier die 152 (e.g., the drain terminal 258 of transistor 257, FIG. 2) and a terminal 149 configured for coupling with a ground reference voltage.

The peaking amplifier die 152 includes an RF input terminal 154, an RF output terminal 158, and one or more amplification stages coupled between the input and output terminals 154, 158, in various embodiments. The RF input terminal 154 is coupled to the second output 126 of the power splitter 120, and thus the RF input terminal 154 receives the peaking signal produced by the power splitter 120.

As with the carrier amplifier die 132, each amplification stage of the peaking amplifier die 152 includes a power transistor with a control terminal and first and second current-carrying terminals. The power transistor(s) of the peaking amplifier die 152 may be electrically coupled between the RF input and output terminals 154, 158 in a manner similar to that described above in conjunction with the description of the carrier amplifier die 132. Additional other details discussed with in conjunction with the description of the carrier amplifier die 132 also apply to the peaking amplifier die 152, and those additional details are not reiterated here for brevity.

The RF output terminal 158 of the peaking amplifier die 152 is coupled to the power combining node 180. According to an embodiment, the RF output terminal 158 of the peaking amplifier die 152 and the combining node 180 are implemented with a common element. More specifically, in an embodiment, the RF output terminal 158 of the peaking amplifier die 152 is configured to function both as the combining node 180 and as the output terminal 158 of the peaking amplifier die 152. In addition, the RF output terminal 158 is configured to enable a connection between the second end of the phase shift and impedance inversion structure 170 and the peaking amplifier die 152 (e.g., implemented with a wirebond array) to extend in a direction that is angularly offset from (e.g., perpendicular to) the direction of the RF signal through the peaking amplifier die 152 (e.g., as indicated with arrow 150). This may be accomplished, for example, by providing a portion of the output terminal 158 (e.g., drain terminal), which is elongated in a direction that is parallel with the direction of the RF signal through the peaking amplifier die 152, where the second end of the phase shift and impedance inversion structure 170 is connected to the elongated portion of the output terminal 158.

The RF output terminal 158 of the peaking amplifier die 152 is coupled to the second shunt inductance circuit 141. Similar to the first shunt inductance circuit, the second shunt inductance circuit 141 also includes a shunt inductance 146 coupled in series with a shunt capacitance 147 (e.g., a DC blocking capacitor). According to an embodiment, the second shunt inductance circuit 141 also includes an RF cold point node 148 between shunt inductor 146 and shunt capacitor 147. Again, the capacitance of the shunt capacitor 147 is chosen to provide a virtual ground reference voltage for the RF electrical signals at node 148, such that inductive element 146 functions as a shunt inductance to the RF ground voltage. In addition, in an embodiment, the RF cold point node 144 is coupled to a drain bias voltage terminal 117, which may be coupled to a bias circuit for providing a DC bias voltage to the drain of the final-stage amplifier of the peaking amplifier die 152. Once again, the series combination of inductive element 146 and capacitor 147 is configured to at least partially resonate out the effects of the parasitic drain-source capacitance, Cds, of the final-stage transistor of the peaking amplifier die 152.

The amplified carrier and peaking RF signals combine in phase at the combining node 180. The combining node 180 is electrically coupled to the RF output node 114 to provide the amplified and combined RF output signal to the RF output node 114. In an embodiment, an output impedance matching network 184 between the combining node 180 and the RF output node 114 functions to present proper load impedances to each of the carrier and peaking amplifier die 132, 152. The resulting amplified RF output signal is produced at RF output node 114, to which an output load 190 (e.g., an antenna) is connected.

Amplifier 100 is configured so that the carrier amplifier path 130 provides amplification for relatively low-level input signals, and both amplification paths 130, 150 operate in combination to provide amplification for relatively high level input signals. This may be accomplished, for example, by biasing the carrier amplifier die 132 so that the carrier amplifier die 132 operates in a class AB mode, and biasing the peaking amplifier die 152 so that the peaking amplifier die 152 operates in a class C mode.

In an embodiment of FIG. 1, a phase shift element in splitter 120 imparts about 90 degrees of phase shift to the peaking signal prior to amplification, and phase shift and impedance inversion structure 170 similarly imparts about 90 degrees of phase shift to the amplified carrier signal so that the amplified carrier and peaking signals may combine in phase at the combining node 180. Such an architecture is referred to as a non-inverted Doherty amplifier architecture. In an alternate embodiment, a phase shift element in splitter 120 may impart about 90 degrees of phase shift to the carrier signal prior to amplification, rather than to the peaking signal, the combining node may be implemented at the output of the carrier amplifier, and the phase shift and impedance inversion structure 170 may impart about a 90-degree phase shift to the amplified peaking amplifier signal between the output of the peaking amplifier die 152 and the output of the carrier amplifier die 132. Such an alternate architecture is referred to as an inverted Doherty amplifier architecture. In still other alternate embodiments, other combinations of phase shift elements may be implemented in the carrier and/or peaking paths 130, 150 prior to amplification to achieve about 90 degrees of phase difference between the carrier and peaking signals prior to amplification, and the phase shifts applied to the amplified carrier and peaking signals may be selected accordingly to ensure that the signals combine in phase at combining node 180. For example, phase shifts greater than 90 degrees may be applied along the carrier and peaking paths 130, 150.

According to an embodiment, the physical components of the carrier and peaking paths 130, 150 are oriented, with respect to each other, so that corresponding portions of the carrier and peaking amplification paths 130, 150 extend in directions that are substantially different from each other. As used herein, the term "signal path" refers to the path followed by an RF signal through a circuit. For example, a portion of a first signal path through the carrier amplifier die 132 extends in a first direction (indicated by arrow 130) between the RF input and output terminals 134, 138. Similarly, a portion of a second signal path through the peaking amplifier die 152 extends in a second direction (indicated by arrow 150) between the RF input and output terminals 154, 158, where the first and second directions are substantially different from each other. In the illustrated embodiment, the first and second directions are perpendicular to each other (i.e., angularly separated by 90 degrees). In other embodiments, the first and second directions may be angularly separated by less or more than 90 degrees. For example, the first and second directions may be angularly separated by any angle between 45 degrees and 315 degrees, in other embodiments. As used herein, the term "substantially different," when referring to the angular separation between directions of corresponding portions of the first and second signal paths, means that the angular separation between the path portions is at least +/−45 degrees.

According to an embodiment, the angular separation between directions of the portions of the first and second signal paths that traverse the carrier and peaking amplifier die 132, 152 is achieved by orienting the carrier and peaking amplifier die 132, 152 so that the signal paths between their respective RF input and output terminals 134, 138, 154, 158 are angularly separated. For example, the carrier and peaking amplifier die 132, 152 are oriented perpendicularly, in an embodiment, so that the directions of the portions of the signal paths through the carrier and peaking amplifier die 132, 152 also are perpendicular.

During operation, the angular separation of the signal paths through the carrier and peaking amplifier die 132, 152 may significantly reduce the amount of coupling between those portions of the signal paths, when compared with a system in which the carrier and peaking die and/or carrier and peaking signal paths run parallel with each other. Given this reduction in coupling between the signal paths, the carrier and peaking amplifier die 132, 152 may be positioned closer together than they could be with conventional parallel orientations, while still achieving acceptable performance. Accordingly, implementation of the various embodiments may enable high-performance Doherty amplifiers to be implemented in relatively small packages or modules, when compared with the sizes of packages or systems used to house conventionally-arranged Doherty amplifiers.

In addition, embodiments of the inventive subject matter include a Doherty amplifier module with a multi-layer substrate (e.g., substrate 410, 510, 810, 910, FIGS. 4, 5, 8A, 9A) that includes a ground plane height variation structure (e.g., structure 420, 520, 720, 820, 920, FIGS. 4-7, 8A, 8B, 9A, 9B) underneath the inverter line (e.g., inverter line 272, FIGS. 2, 4, 5, 8A, 9A). The ground plane height variation structure effectively decreases the distance, through the substrate, between the inverter line and the system ground plane, without affecting the distance, through the substrate, between other portions of the Doherty amplifier and the system ground plane. This approach effectively thins the substrate underneath the inverter line to enable inverter lines of similar widths to be utilized for Doherty amplifier modules designed for different power levels.

Embodiments of a physical implementation of the Doherty amplifier circuit of FIG. 1 now will be described in detail in conjunction with FIGS. 2-9. More specifically, FIG. 2 is a top view of a Doherty amplifier module 200, 400, 500, 800, 900, in accordance with various example embodiments. FIG. 2 should be viewed simultaneously with FIGS. 3-5, 8A, 8B, 9A, and 9B, which are cross-sectional, side views of a portion of the module 200, 400, 500, 800, 900 of FIG. 2 along line X-X. Because the top view may appear substantially the same for each of the multiple embodiments, FIG. 2 is intended to represent a top view for each module 200, 400, 500, 800, 900 depicted in cross-section in FIGS. 3-5, 8A, and 9A. In addition, where components in FIGS. 2-9 correspond to substantially similar or identical components, the same reference numbers are used.

Doherty amplifier module 200, 400, 500, 800, 900 includes a substrate 210, 410, 510, 810, 910, a power splitter 220 (e.g., power splitter 120, FIG. 1), a carrier amplifier die 232 (e.g., carrier amplifier die 132, FIG. 1), a peaking amplifier die 252 (e.g., peaking amplifier die 152, FIG. 1), a phase shift and impedance inversion structure 270 (e.g., phase shift and impedance inversion structure 170, FIG. 1), a first shunt impedance circuit 240 (e.g., circuit 140, FIG. 1)

coupled to the carrier amplifier die 232, a second shunt impedance circuit 241 (e.g., circuit 141, FIG. 1) coupled to the peaking amplifier die 252, and various other circuit elements, which will be discussed in more detail below.

The Doherty amplifier module 200, 400, 500, 800, 900 may be implemented as a land grid array (LGA) module, for example. Accordingly, the substrate 210, 410, 510, 810, 910 has a component mounting surface 212 (also referred to herein as an "upper" or "top" surface) and a land surface 214 (also referred to herein as a "lower" or "bottom" surface). Conductive landing pads 216, 217, 218, 219, 249, 251 of the LGA are exposed at the land surface 214, where the locations of some example landing pads 216-219, 249, 251 are indicated with dashed boxes in FIG. 2. Although module 200, 400, 500, 800, 900 is depicted as an LGA module, module 200, 400, 500, 800, 900 alternatively may be packaged as a pin grid array module, a quad flat no leads (QFN) module, or another type of package. Either way, the component mounting surface 212 and the components mounted to that surface 212 optionally may be covered with an encapsulant material (e.g., encapsulant material 330, FIGS. 3-5, 8A, 9A, such as a plastic encapsulant). In an alternate embodiment, the components could be contained within an air cavity, which is defined by various structures (not illustrated) overlying the mounting surface 212.

According to an embodiment, the substrate 210 is relatively small, which provides for a particularly compact Doherty amplifier. For example, the component mounting surface 212 may have a width (horizontal dimension in FIG. 2) and a length (vertical dimension in FIG. 2) in a range of about 5 millimeters (mm) to about 20 mm, although the width and/or length may be smaller or larger, as well. In a particular embodiment, for example, the component mounting surface may have a width of about 10 mm and a length of about 6 mm.

A plurality of non-overlapping zones is defined at the mounting surface 212 of the substrate 210, 410, 510, 810, 910, where each zone includes the portion of the substrate 210, 410, 510, 810, 910 within the indicated zone boundaries and between the mounting surface 212 and the land surface 214. More specifically, the non-overlapping zones include an input signal and splitter zone 201, a first-die mounting zone 202, a second-die mounting zone 203, an interamplifier impedance inverter zone 204 (referred to herein as an "inverter zone"), and an output match zone 205. Within the input signal and splitter zone 201, a conductive landing pad 216 exposed at the land surface 214 is electrically coupled through the substrate 210, 410, 510, 810, 910 to a conductive contact 290 at the mounting surface 212. The landing pad 216 and contact 290, along with the electrical connections between them, function as the RF input node (e.g., RF input node 112, FIG. 1) for the module 200, 400, 500, 800, 900.

The power splitter 220 is coupled to the mounting surface 212 in the input signal zone 201. According to an embodiment, the power splitter 220 may include one or more discrete die and/or components, although it is represented in FIG. 2 as a single element. The power splitter includes an input terminal 222 (e.g., input 122, FIG. 1) and two output terminals 224, 226 (e.g., outputs 124, 126, FIG. 1). The input terminal 222 is electrically coupled (e.g., through wirebonds, as shown) to conductive contact 290 to receive an input RF signal. In addition, the output terminals 224, 226 are electrically coupled (e.g., through additional wirebonds, as shown) to conductive contacts 291, 292 at the mounting surface 212. The power splitter 220 is configured to split the power of the input RF signal received through input terminal 222 into first and second RF signals (e.g., carrier and peaking signals), which are produced at the output terminals 224, 226. In addition, the power splitter 220 may include one or more phase shift elements configured to impart about a 90-degree phase difference between the first and second RF signals provided at output terminals 224, 226. As discussed previously, the power splitter 220 may consist of fixed-value, passive components, or the power splitter 220 may include variable phase shifters and/or attenuators.

The first and second RF signals may have equal or unequal power, as discussed previously. The first RF signal produced at output terminal 224 and conveyed to conductive contact 291 is amplified through a carrier amplifier path. The carrier amplifier path includes an input circuit 275 (e.g., input circuit 128, FIG. 1) mounted within the input signal zone 201, a carrier amplifier die 232 (e.g., die 132, FIG. 1) mounted within the first-die mounting zone 202, and a phase shift and impedance inversion structure 270 (e.g., phase shift and impedance inversion structure 170, FIG. 1). The phase shift and impedance inversion structure 270 includes a series combination of an inverter line 272 (e.g., inverter line 172, FIG. 1) connected to the substrate 210, 410, 510, 810, 910 within the inverter zone 204, and wirebond arrays 261, 263 that electrically connect the inverter line 272 to the outputs of dies 232, 252. A shunt inductance circuit 240 (e.g., shunt inductance circuit 140, FIG. 1) may be connected to the output terminal 238 of the carrier amplifier die 232.

The input circuit 275 is electrically connected between conductive contacts 291 and 293. Although the detail is not shown in FIG. 2, the input circuit 275 may include a plurality of discrete and/or integrated components (e.g., inductors and capacitors) configured to provide proper impedance matching between the first power splitter output 224 and the input to the carrier die 232.

Conductive contact 293 is electrically coupled (e.g., with wirebonds 260) to an RF input terminal 233 of the carrier amplifier die 232, in order to provide an RF carrier signal for amplification to the carrier amplifier die 232. The illustrated embodiment of carrier amplifier die 232 embodies a two-stage amplifier. More specifically, the electrical components of carrier amplifier die 232 include an RF input terminal 233, an input matching network 234, a driver stage transistor 235, an interstage matching network 236, an output or final-stage transistor 237, and an RF output terminal 238. The driver and output transistors 235, 237 are coupled in series between the input and output terminals 233, 238. The driver transistor 235 is configured to apply a relatively low gain to the carrier signal, and the output transistor 237 is configured to apply a relatively high gain to the carrier signal after preliminary amplification by the driver transistor 235. In other embodiments, the carrier amplifier die 232 may embody a single stage amplifier, or may include more than two amplification stages.

Each of the transistors 235, 237 may be a field effect transistor (FET) (such as a metal oxide semiconductor FET (MOSFET), a laterally diffused MOSFET (LDMOS FET), a high electron mobility transistor (HEMT), and so on). Alternatively, each of the transistors 235, 237 may be a bipolar junction transistor (BJT). References herein to a "gate," "drain," and "source," which are commonly used to describe FETs, are not intended to be limiting, as each of these designations has analogous features for BJT implementations. In various embodiments, the semiconductor substrates on which transistors 235, 237 are formed may comprise silicon, silicon-on-insulator (SOI), silicon-on-sapphire (SOS), gallium arsenide (GaAs), gallium nitride (GaN), GaN on silicon carbide, GaN on silicon, or other types of substrate materials.

The input terminal 233 of die 232 is electrically coupled to the gate terminal of transistor 235 through input matching network 234, and the drain terminal of transistor 235 is electrically coupled to the gate terminal of transistor 237 through inter-stage matching network 236. According to an embodiment, the drain terminal of transistor 237 is electrically coupled to output terminal 238. Accordingly, the signal path through the carrier amplifier die 232 is in a direction extending from the RF input terminal 233 toward the RF output terminal 238, which direction is indicated by arrow 230.

An amplified RF carrier signal is produced by the carrier amplifier die 232 at the RF output terminal 238. The RF output terminal 238 may be electrically coupled through a first shunt inductance circuit 240 to a landing pad 251. The first shunt inductance circuit 240 includes a first inductive element in the form of a set of wirebonds 242, a second inductive element in the form of discrete inductors 267, 268, and a capacitor 243, where the first and second inductive elements 242, 267, 268 and the capacitor 243 are connected in series between the RF output terminal 238 and the landing pad 251. The first and second inductive elements 242, 267, 268 correspond to shunt inductive element 142 (FIG. 1), and capacitor 243 corresponds to shunt capacitor 143 (FIG. 1), for example. The capacitor 243 may be in the form of a chip capacitor, a metal-insulator-metal (MIM) capacitor, or another type of surface mount capacitor, desirably with a relatively high Q. The wirebonds 242 extend from the RF output terminal 238 to conductive pad 245. Discrete inductors 267, 268 each have a first terminal coupled to the conductive pad 245, and a second terminal coupled to conductive trace 298. Capacitor 243 has a first terminal coupled to the conductive trace 298, and a second terminal coupled to conductive pad 244. The conductive pad 244 is electrically connected through the substrate 210, 410, 510, 810, 910 to landing pad 251. When integrated with a larger RF system, landing pad 251 may be connected to system ground.

According to an embodiment, the series combination of wirebonds 242 and discrete inductors 267, 268 are configured to provide an inductance that is sufficient to resonate out at least some of the drain-source capacitance of transistor 237. For example, the total series inductance of wirebonds 242 and discrete inductors 267, 268 may be configured to have an inductance value in a range of about 0.5 nanohenries (nH) to about 5.0 nH, although the series combination of wirebonds 242 and discrete inductors 267, 268 may be configured to have a smaller or larger inductance value, as well. In an alternate embodiment, the series combination of wirebonds 242 and discrete inductors 267, 268 may be replaced with simply a set of wirebonds (e.g., as will be discussed in conjunction with the second shunt inductance circuit 241, later).

As discussed previously, the shunt capacitor 243 has a capacitance value that is chosen to provide a virtual ground reference voltage for the RF electrical signals at conductive trace 298, such that wirebonds 242 function as a shunt inductance to the RF ground voltage. Desirably, the shunt capacitor 243 is series resonant in band. For example, shunt capacitor 243 may have a capacitance value in a range of about 5.6 pF to about 33.0 pF, or more specifically in a range of about 8.0 pF to about 12.0 pF, although the capacitance value may be smaller or larger, as well.

Because trace 298 corresponds to an RF cold point node, in an embodiment, trace 298 may be used to provide a DC bias voltage to the drain of the final-stage transistor 237 through output terminal 238. Accordingly, in an embodiment, trace 298 also may be coupled through the substrate 210, 410, 510, 810, 910 to landing pad 218. Landing pad 218, in turn, may be coupled to a drain bias circuit in the RF system to which module 200, 400, 500, 800, 900 ultimately is connected.

In an embodiment, the RF output terminal 238 is electrically coupled, through a first wirebond array 261 (i.e., a plurality of parallel, closely spaced wirebonds), to a first end of inverter line 272 (i.e., a transmission line), which is coupled to the substrate 210 and is at least partially exposed at the mounting surface 212, in an embodiment. In some embodiments, an entirety of the inverter line 272 is connected to and exposed at the mounting surface 212 (e.g., inverter line 272 is formed from a portion of patterned conductive layer 315). In alternate embodiments, all or portions of the inverter line 272 may be formed from portion(s) of interior conductive layers (e.g., from portion(s) of layer(s) 310-314). According to an embodiment, the RF output terminal 238 of carrier amplifier die 232 includes an elongated first pad that is configured to enable wirebonds 261 to be connected to the inverter line 272 so that the wirebonds 261 extend in a direction that is angularly offset from (e.g., perpendicular to) the direction of the signal path through the carrier amplifier die 232 (e.g., wirebonds 261 may extend in the direction indicated by arrow 250). Further, the RF output terminal 238 may include an elongated second pad that is configured to enable the wirebonds 242 corresponding to the first shunt inductive element of the shunt inductance circuit 240 to be connected to the second pad so that the wirebonds 242 extend in a direction that is substantially parallel to the direction of the signal path through the carrier amplifier die 232 (i.e., wirebonds 242 may extend in the direction indicated by arrow 230). As illustrated in FIG. 2, the wirebonds of the wirebond array 242 are aligned in the same direction as the RF signal path through the carrier amplifier die 232 (e.g., in the direction indicated by arrow 230). In an embodiment, wirebond arrays 242, 261 are perpendicularly arranged with respect to each other at adjacent sides of die 232.

As mentioned above, through the wirebond array 261, the RF output terminal 238 is electrically coupled to inverter line 272, which is located in the inverter zone 204. According to an embodiment, inverter line 272 is implemented with a transmission line (e.g., a microstrip line) having an electrical length of less than lambda/4 ($\lambda/4$), where lambda corresponds to the wavelength of a center frequency within a bandwidth of operation of the module 200, 400, 500, 800, 900. The inverter line 272 has a first end that is proximate to the carrier amplifier die 232 (and more particularly within a wirebond length of the RF output terminal 238), and a second end that is proximate to the peaking amplifier die 252 (and more particularly within a wirebond length of the RF output terminal 258 of the peaking amplifier die 252). As used herein, "within a wirebond length" means within a distance between about 125 microns and about 200 microns, although the term may mean a smaller or larger distance, as well. According to an embodiment, the inverter line 272 may be formed from a portion of conductive layer 315 on the mounting surface 212 of the module substrate 210, 410, 510, 810, 910. In other embodiments, the inverter line 272 also or alternatively may be formed from portion(s) of one or more lower metal layers.

As will be described in more detail later, an embodiment of a ground plane height variation structure (e.g., structure 420, 520, 720, 820, 920, FIGS. 4-9) underlying the inverter line 272 is used to effectively decrease the distance, through the substrate 410, 510, 810, 910, between the inverter line 272 and the system ground plane. Accordingly, the ground plane height variation structure may be used to alter the characteristic impedance of the inverter line 272. In various embodiments, the ground plane height variation structure may enable an impedance line 272 with a desired characteristic impedance to fit within a smaller footprint than could be achieved without the ground plane height variation structure. Accordingly, the use of a ground plane height variation structure may facilitate the design of relatively compact modules without performance degradation.

Moving back to the power splitter 220 in the input signal and splitter zone 201, the second RF signal (i.e., the peaking signal) produced at output terminal 226 of the power splitter 220 and conveyed to conductive contact 292 is amplified through a peaking amplifier path. The peaking amplifier path includes input circuit 274 within the input signal and splitter zone 201, a peaking amplifier die 252 (e.g., die 152, FIG. 1) mounted within the second-die mounting zone 203, and a shunt inductance circuit 241 (e.g., shunt inductance circuit 141, FIG. 1) connected to the output terminal 258 of the peaking amplifier die 252. As mentioned above, the power splitter 220 may impart about a 90-degree phase shift to the RF signal provided at output terminal 226. Accordingly, the phase of the peaking signal received at input terminal 253 of peaking die 252 is delayed by about 90 degrees with respect to the carrier signal received at input terminal 233 of carrier die 232.

The input circuit 274 is electrically connected between conductive contacts 292 and 294. Although the detail is not shown in FIG. 2, the input circuit 274 may include a plurality of discrete and/or integrated components (e.g., inductors and capacitors) configured to provide proper impedance matching between the second power splitter output 226 and the input to the peaking die 252. As shown in FIG. 2, the conductive contacts 291-294 and the input circuits 274, 275 are arranged so that the output terminal 226 that produces the peaking signal is farther from the peaking amplifier die 252 than the output terminal 224 that produces the carrier signal, and the conductive path between the output terminal 226 and the RF input terminal 253 of the peaking amplifier die 252 crosses over the conductive path between the output terminal 224 and the RF input terminal 233 of the carrier amplifier die 232 (although a cross-under also could be implemented). Alternatively, the conductive path between the output terminal 226 and the RF input terminal 253 of the peaking amplifier die 252 may be configured so that it does not cross over (or under) the conductive path between the output terminal 224 and the RF input terminal 233 of the carrier amplifier die 232.

Conductive contact 294 is electrically coupled (e.g., with wirebonds 266) to an RF input terminal 253 of the peaking amplifier die 252, in order to provide an RF carrier signal for amplification to the peaking amplifier die 252. The illustrated embodiment of peaking amplifier die 252 also embodies a two-stage amplifier. More specifically, the electrical components of peaking amplifier die 252 include an RF input terminal 253, an input matching network 254, a driver transistor 255, an interstage matching network 256, an output transistor 257, and an RF output terminal 258. The driver and output transistors 255, 257 are coupled in series between the input and output terminals 253, 258. The driver transistor 255 is configured to apply a relatively low gain to the peaking signal, and the output transistor 257 is configured to apply a relatively high gain to the peaking signal after preliminary amplification by the driver transistor 255. In other embodiments, the peaking amplifier die 252 may embody a single stage amplifier, or may include more than two amplification stages. Again, each of the transistors 255, 257 may be a FET or a BJT.

The input terminal 253 of die 252 is electrically coupled to the gate terminal of transistor 255 through input matching network 254, and the drain terminal of transistor 255 is electrically coupled to the gate terminal of transistor 257 through inter-stage matching network 256. According to an embodiment, the drain terminal of transistor 257 is electrically coupled to output terminal 258. Accordingly, the signal path through the carrier amplifier die 252 is in a direction extending from the RF input terminal 253 toward the RF output terminal 258, which direction is indicated by arrow 250.

An amplified RF peaking signal is produced by the peaking amplifier die 252 at the RF output terminal 258. In an embodiment, and as mentioned above, the RF output terminal 258 is electrically coupled to inverter line 272 with wirebond array 263, and RF output terminal 258 functions as a combining node 280 (e.g., combining node 180, FIG. 1) at which the amplified and delayed carrier amplifier signal is combined, in phase, with an amplified peaking amplifier signal.

In addition, according to an embodiment, the RF output terminal 258 is electrically coupled through a second shunt inductance circuit 241 to a landing pad 249. According to one embodiment, the second shunt inductance circuit 241 includes an inductive element (e.g., shunt inductive element 146, FIG. 1) in the form of a set of wirebonds 246, in series with a capacitor 247 (e.g., shunt capacitor 147, FIG. 1) in the form of a chip capacitor, a MIM capacitor, a capacitor integrated within an IPD, a capacitor integrated within an LTCC device, or another type of surface mount capacitor with a relatively high Q. The wirebonds 246 extend from the RF output terminal 258 to conductive trace 295. Capacitor 247 has a first terminal coupled to the conductive trace 295, and a second terminal coupled to conductive pad 248. The conductive pad 248 is electrically connected through the substrate 210, 410, 510, 810, 910 to landing pad 249. When integrated with a larger RF system, landing pad 249 may be connected to system ground.

Figure 2:
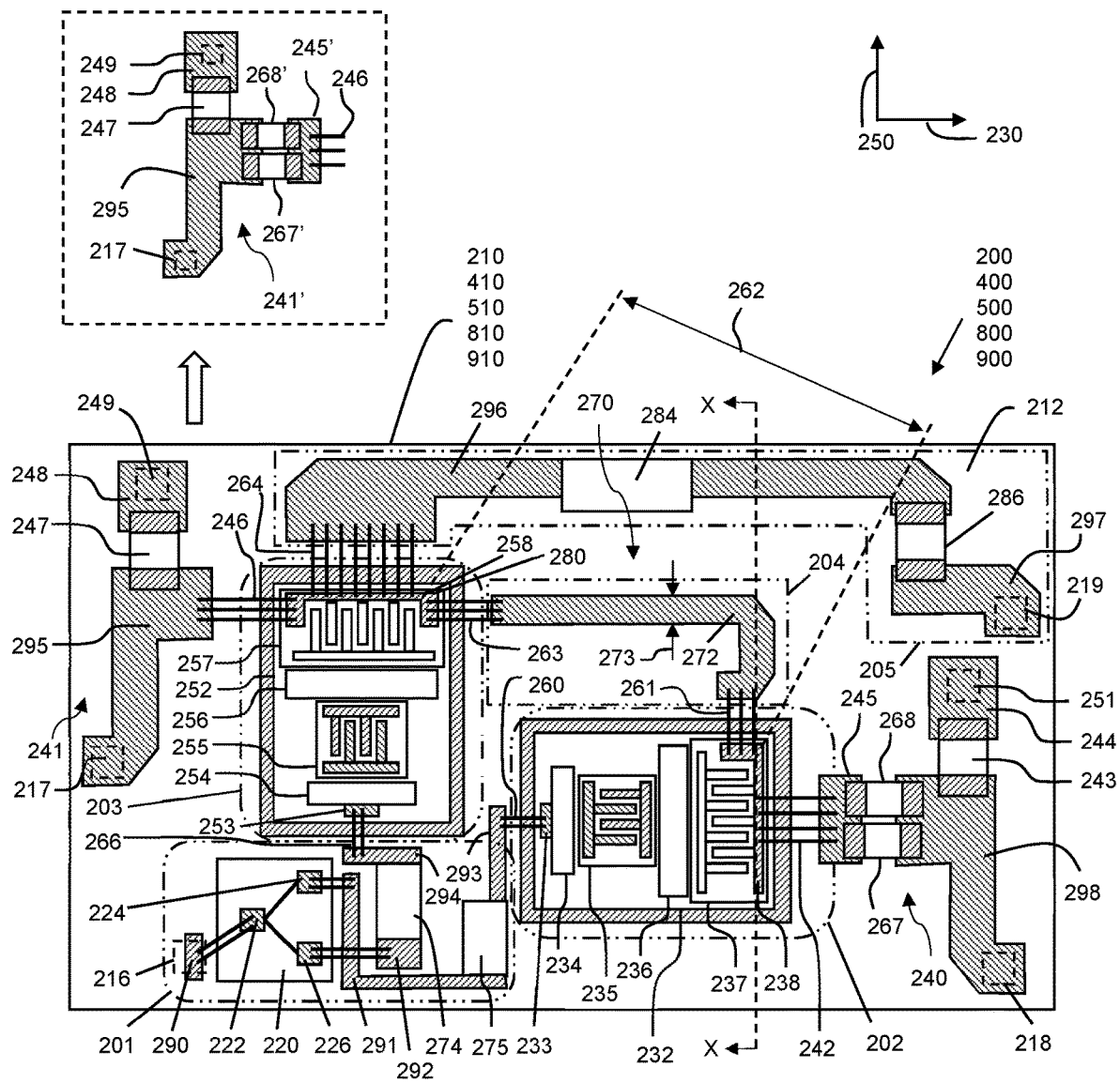
FIG. 2 is a top view of a Doherty amplifier module, in accordance with an example embodiment.
Figure 3:
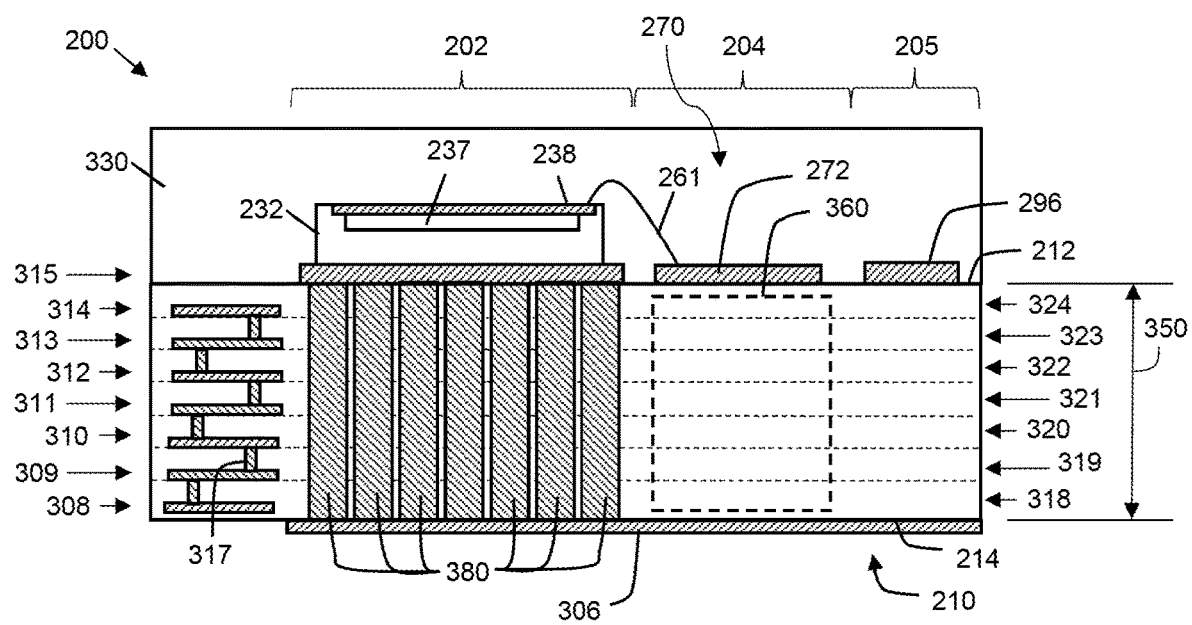
FIG. 3 is a cross-sectional, side view of a portion the module of FIG. 2 along line X-X, where the module does not include a ground plane height variation structure.

In an alternate embodiment, and as indicated in the dashed box in FIG. 2, the second shunt inductance circuit 241 may be configured in the same way as the first shunt inductance circuit 240. More specifically, rather than implementing the shunt inductance between output terminal 258 and conductive trace 295 simply as a set of wirebonds 246, the shunt inductance could be implemented as a set of wirebonds 246 in series with discrete inductors 267', 268'.

According to an embodiment, the wirebonds 246 (or wirebonds 246 and discrete inductors 267', 268') are configured to provide an inductance that is sufficient to resonate out at least some of the drain-source capacitance of transistor 257. As discussed in detail above, this enables the electrical and physical length of the inverter line 272 to be increased, in comparison with the electrical and physical length that may be used if the first shunt inductance circuit 241 were excluded from the module 200, 400, 500, 800, 900. For example, the wirebonds 246 may be configured to have an inductance value in a range of about 0.5 nH to about 5.0 nH, although the wirebonds 246 may be configured to have a smaller or larger inductance value, as well. Although the illustrated embodiment shows the shunt inductive element as a set of two wirebonds 246, other embodiments may include more or fewer wirebonds to achieve a desired inductance value. Further, the inductance value may be controlled through variation of the loop heights of the wirebonds 246.

As discussed previously, the shunt capacitor 247 has a capacitance value that is chosen to provide a virtual ground reference voltage for the RF electrical signals at conductive trace 295, such that wirebonds 246 function as a shunt inductance to the RF ground voltage. Desirably, the shunt capacitor 247 is series resonant in band. For example, shunt capacitor 247 may have a capacitance value in a range of about 5.6 pF to about 33.0 pF, or more specifically in a range of about 8.0 pF to about 12.0 pF, although the capacitance value may be smaller or larger, as well.

Because trace 295 corresponds to an RF cold point node, in an embodiment, trace 295 may be used to provide a DC bias voltage to the output terminal 258 of transistor 257. Accordingly, in an embodiment, trace 295 also may be coupled through the substrate 210, 410, 510, 810, 910 to landing pad 217. Landing pad 217, in turn, may be coupled to a drain bias circuit in the RF system to which module 200, 400, 500, 800, 900 ultimately is connected.

The RF output terminal 258 of peaking amplifier die 252 includes an elongated first pad that is configured to enable wirebonds of a first wirebond array 263 to be connected to the first pad so that the wirebonds extend in a direction that is angularly offset from (e.g., perpendicular to) the direction of the signal path through the peaking amplifier die 252 (e.g., wirebonds 263 may extend in the direction indicated by arrow 230). Further, the RF output terminal 258 may include an elongated second pad that is configured to enable the wirebonds of the second wirebond array 264 to be connected to the second pad so that the wirebonds extend in a direction that is substantially parallel to the direction of the signal path through the peaking amplifier die 252 (i.e., wirebonds 264 may extend in the direction indicated by arrow 250). Further still, the RF output terminal 258 of peaking amplifier die 252 may include an elongated third pad that is configured to enable wirebonds of a third wirebond array 246 to be connected to the third pad so that the wirebonds extend in a direction that is angularly offset from (e.g., perpendicular to) the direction of the signal path through the peaking amplifier die 252 (e.g., wirebonds 246 may extend in a direction that is 180 degrees offset from the direction indicated by arrow 230).

The signal path through the peaking amplifier die 252 is in a direction extending from the RF input terminal 253 to the RF output terminal 258, which direction is indicated by arrow 250. As can be seen in FIG. 2, the signal paths through the peaking and carrier amplifier die 252, 232 extend in significantly different directions, and more particularly the signal paths are perpendicular in the embodiment of FIG. 2.

According to an embodiment, except for the configurations of the RF output terminals 238, 258, the peaking amplifier die 252 may be structurally identical to the carrier amplifier die 232, meaning that the two dies 232, 252 include the same structural and electrical elements arranged and interconnected in the same manner. According to a further embodiment, the peaking amplifier die 252 and the carrier amplifier die 232 also are identical in size, characterizing the Doherty amplifier module 200, 400, 500, 800, 900 as a symmetric Doherty amplifier. In an alternate embodiment, the peaking amplifier die 252 and the carrier amplifier die 232 may have different sizes, characterizing the Doherty amplifier module 200, 400, 500, 800, 900 as an asymmetric Doherty amplifier. For example, the peaking amplifier die 252 may be larger than the carrier amplifier die 232 by a ratio (e.g., 1.6:1, 2:1, or some other ratio).

Either way, each die 232, 252 is rectangular in shape with parallel first and second sides, and parallel third and fourth sides extending between the first and second sides. In each die 232, 252, the RF input terminal 233, 253 is proximate to the first side of the die, and portions of the RF output terminal 238, 258 may be proximate to the second side of the die. The first sides of each die 232, 252 are oriented toward the input signal zone 201, and the first sides of the die 232, 252 are perpendicularly arranged, with respect to each other, in an embodiment. Said another way, the structurally identical carrier and peaking amplifier die 232, 252 are coupled to the mounting surface 212 of the substrate 210, 410, 510, 810, 910 so that the die 232, 252 are perpendicular to each other, rendering the RF signal paths through the die 232, 252 also perpendicular to each other. Even though the die 232, 252 may be positioned relatively close together, their perpendicular orientations may significantly reduce coupling between signals carried through and amplified by the die 232, 252.

As mentioned above, through the wirebond array 263, the RF output terminal 258 is electrically coupled to inverter line 272. Accordingly, the amplified carrier signal produced by the carrier amplifier die 232 is received at the RF output terminal 258 of the peaking amplifier die 252 through the series combination of wirebond array 261, inverter line 272, and wirebond array 263. The amplified peaking signal produced by the peaking amplifier die 252 also is received at the RF output terminal 258, and the module 200, 400, 500, 800, 900 is configured so that the amplified carrier and peaking signals arrive and are combined at output terminal 258 (or combining node 280) in phase with each other.

Above some operational frequency threshold, as discussed in detail above, the linear distance 262 between the output terminals 238, 258 of the carrier and peaking die 232, 252 would be too long to accommodate a phase shift and impedance inversion structure that is relied upon exclusively (i.e., without shunt inductance circuits 240, 241) to resonate out the source-drain capacitances of the transistors 237, 257. More specifically, if the inverter line 272 plus wirebond arrays 261, 263 are relied upon to resonate out the entire effect of the drain-source capacitances of the transistors 237, 257, the desired physical length of the inverter line 272 may be significantly shorter, for operational frequencies above a high frequency threshold, than the linear distance 262 between the output terminals 238, 258. This issue may be overcome by including one or both of the shunt inductance circuits 240, 241, each of which at least partially resonates out the drain-source capacitances of the transistors 237, 257. In other words, whereas the inverter line 272 would have a first physical length (and thus a first electrical length) if both shunt inductance circuits 240, 241 were excluded from the module 200, 400, 500, 800, 900, the inverter line 272 may have a longer physical length (and thus a longer electrical length) when the shunt inductance circuits 240, 241 are included in the module 200, 400, 500, 800, 900.

According to an embodiment, the RF output terminal 258 (or combining node 280) is electrically coupled to conductive output line 296 at the mounting surface 212 with wirebond array 264. As illustrated in FIG. 2, the wirebonds of the wirebond array 264 are aligned in the same direction as the RF signal path through the peaking amplifier die 252 (e.g., in the direction indicated by arrow 250). In an embodiment, wirebond arrays 263, 264 are perpendicularly arranged with respect to each other at adjacent sides of die 252, wirebond arrays 246, 264 also are perpendicularly arranged with respect to each other at adjacent sides of die 252, and wirebond arrays 263, 246 are arranged in parallel with each other at opposing sides of the peaking amplifier die 252. Accordingly, even though the wirebond arrays 263, 264 and wirebond arrays 246, 264 may be positioned relatively close together, their perpendicular orientations may significantly reduce coupling of RF signals carried through the wirebond arrays 246, 263, 264.

An output impedance matching network 284 and/or a decoupling capacitor 286 may be coupled along output line 296, in an embodiment. The output impedance matching network 284 functions to present the proper load impedance to combining node 280. Although the detail is not shown in FIG. 2, the output impedance matching network 284 may include various discrete and/or integrated components (e.g., capacitors, inductors, and/or resistors) to provide the desired impedance matching. The output impedance matching network 284 is electrically coupled through the substrate 210, 410, 510, 810, 910 to conductive landing pad 219 exposed at the land surface 214. The landing pad 219 functions as the RF output node (e.g., RF output node 114, FIG. 1) for the module 200, 400, 500, 800, 900.

Besides the bias circuitry connections previously discussed (e.g., including elements 217, 218, 295, 298), module 200, 400, 500, 800, 900 also may include additional bias circuitry and/or bias circuitry connections configured to provide gate and drain bias voltages to some or all of the driver and output transistors 235, 255, 237, 257. For example, the bias circuitry may include, among other things, a plurality of landing pads (at the land surface 214 of the substrate 210, 410, 510, 810, 910), contacts (at the mounting surface 212 of the substrate 210, 410, 510, 810, 910), and other conductive structures and circuitry. Bias voltages provided to the gates and/or drains of the transistors 235, 255, 237, 257 facilitate Doherty operation of the module. For example, the transistors 235, 237 of the carrier amplifier die 232 may be biased to operate in class AB mode, and the transistors 255, 257 of the peaking amplifier die 252 may be biased to operate in class C mode. The above-described configuration corresponds to a non-inverted Doherty amplifier. In an alternate embodiment, modifications could be made to configure the module 200, 400, 500, 800, 900 to function as an inverted Doherty amplifier.

To facilitate an explanation of the various embodiments of the inventive subject matter, details regarding the substrate 210, 410, 510, 810, 910 will now be provided, along with details regarding several embodiments of ground plane height variation structures (e.g., structures 420, 520, 720, 820, 920, FIGS. 4-9). Referring first to FIGS. 3-6, and according to an embodiment, substrate 210, 410, 510 may be a multi-layer organic substrate (e.g., formed from PCB materials), which includes a plurality of metal layers 308, 309, 310, 311, 312, 313, 314, 315 that are separated by (or interleaved with) a plurality dielectric material layers 318, 319, 320, 321, 322, 323, 324. Conductive vias (e.g., via 317), which extend through the dielectric material layers 318-324, provide for electrical connectivity between the metal layers 308-315.

Each of the carrier and peaking amplifier die 232, 252 are monolithic power transistor integrated circuits (ICs) that may produce significant amounts of heat during operation. In addition, each of the carrier and peaking amplifier die 232, 252 also need access to a ground reference (e.g., to the system ground plane). Accordingly, in an embodiment, substrate 210, 410, 510, 810, 910 also includes a plurality of electrically and thermally conductive trenches 380 to which the carrier and peaking amplifier die 232, 252 are coupled (e.g., with solder, brazing material, silver sinter, or other die attach materials). The trenches 380 extend through an entirety of the substrate thickness 350 in first-die and second-die mounting zones 202, 203 to provide heat sinks and ground reference access to the carrier and peaking amplifier die 232, 252. For example, the conductive trenches 380 may be filled with copper or another thermally and electrically conductive material. In alternate embodiments, the trenches 380 may be replaced with conductive slugs (e.g., copper slugs) or with thermal vias.

According to an embodiment, the lowest internal metal layer 308 is utilized to provide the conductive landing pads 216-219, 249, 251 of the LGA. Further, an additional metal layer 306 may be formed on the bottom surface 214 of the substrate 210, 410, 510, 810, 910, where the additional metal layer 306 may be utilized to convey a ground reference to the module 200, 400, 500, 800, 900. The metal layer 306 and landing pads 216-219, 249, 251 (among others, not illustrated) enable surface mounting of the Doherty amplifier module 200, 400, 500, 800, 900 onto a separate substrate (not illustrated) that provides electrical connectivity to other portions of an RF system.

Some metal layers of the substrate 200, 400, 500, 800, 900 may be used to convey DC voltages (e.g., DC bias voltages) and to provide access to a system ground reference. Other layers may be used to convey RF and other signals to the module 200, 400, 500, 800, 900. Additionally, a patterned metal layer 315 may be formed on the mounting surface 212 of the substrate 200, 400, 500, 800, 900. As discussed above, the patterned metal layer 315 may include a plurality of conductive contacts and traces 244, 248, 290-297 on the mounting surface 212, which facilitates electrical connection to die and other components that may be coupled to the mounting surface 212.

In addition, an inverter line 272, which forms a portion of a phase shift and impedance inversion structure 270, may be formed in the inverter zone 204 from a portion of the patterned metal layer 315 (and/or from portions of one or more other conductive layers). The inverter line 272 is physically defined by a width 273, a thickness (i.e., vertical dimension in FIGS. 3-6), and a length (i.e., a physical length of the path between first and second ends that are proximate to wirebonds 261 and 263, respectively). The width 273 and thickness of the inverter line 272 may be substantially the same along its length, although the width 273 and/or thickness may vary (e.g., +/−20 percent), as well. For example, in some embodiments, the width 273 of the inverter line 272 may be between about 250 microns and about 2000 microns, although the width 273 may be smaller or larger, as well. The thickness of the inverter line 272 may be in a range of about 20 microns to about 50 microns, although the thickness may be smaller or larger, as well. Finally, the length of the inverter line 272 may be in a range of about 2000 microns to about 10000 microns, although the length may be smaller or larger, as well.

As discussed previously, the characteristic impedance of the inverter line 272 is dictated by the power level of the Doherty design (i.e., by the peripheries of the carrier and peaking die 232, 252 and the peaking-to-carrier ratio). Further, for a desired characteristic impedance, the width 273 of the inverter line 272 is determined based on the dielectric constant of the substrate 210, 410, 510, 810, 910 and the distance between the inverter line 272 and the system ground plane.

The dielectric constant of the dielectric layers 318-324 (and thus the dielectric constant of the substrate 210, 410, 510, 810, 910) is in a range of about 2.0 to about 6.0, in various embodiments, although the dielectric constant of the dielectric layers 318-324 may be smaller or larger, as well. Although substrates 210, 410, 510, 810, 910 are depicted to include seven internal metal layers 308-314, and seven dielectric material layers 318-324, substrates that include more or fewer metal layers and/or more or fewer dielectric material layers alternatively may be used. Either way, each of the dielectric material layers 318-324 may have a thickness (vertical dimension in FIGS. 3-5, 8A, 9A) in a range of about 30 microns to about 100 microns, although the thickness of each layer 318-324 may be smaller or larger, as well. In some embodiments, each of the dielectric material layers 318-324 have substantially the same thickness, while in other embodiments, the dielectric material layers 318-324 may have different thicknesses. Given the above example ranges, substrates 210, 410, 510, 810, 910 may have a total thickness 350 between the top and bottom surfaces 212, 214 in a range of about 210 microns to about 700 microns, although the thickness of substrates 210, 410, 510, 810, 910 may be smaller or larger, as well.

As indicated previously, the module 200, 400, 500, 800, 900 may be connected to another system substrate (not illustrated), such as a PCB, which provides the system ground reference. For example, a system ground plane may be located at the top surface of the system substrate to which the bottom surface 214 of the module 200, 400, 500, 800, 900 is connected. In an embodiment, as mentioned above, an additional metal layer 306 may be connected to the bottom surface 214 of the substrate 210, 410, 510, 810, 910, and this additional metal layer 306 may be physically and electrically coupled to the system ground plane (or reference). In other embodiments, the additional metal layer 306 may be excluded from the module 200, 400, 500, 800, 900, and conductive features exposed at the bottom surface of the substrate 210, 410, 510, 810, 910 may be directly coupled to the system ground plane.

The system ground plane may be assumed to be co-planar with (or below) the bottom surface 214 of the substrate 210, 410, 510, 810, 910 (or co-planar with layer 306). Accordingly, the thickness 350 of the module substrate 210, 410, 510, 810, 910 generally defines the distance between various transmission lines (e.g., transmission lines 272, 295, 296, 298) coupled to the top surface 212 of the substrate 210, 410, 510, 810, 910 and the system ground plane. As indicated above, however, embodiments of module substrates may include ground plane height variation structures (e.g., structures 420, 520, 720, 820, 920, FIGS. 4-9) within the inverter zone 204, where each ground plane height variation structure effectively raises the height of the system ground plane underneath the inverter line 272 (i.e., reduces the distance through the substrate 410, 510, 810, 910 between the inverter line 272 and a conductive connection to the system ground plane). Accordingly, the ground plane height variation structures affect the characteristic impedance of the inverter line 272. More specifically, differently-configured ground plane height variation structures may enable a specific physical implementation of an inverter line 272 to have different characteristic impedances, and thus to be suitable for different power level designs. For example, inverter line characteristic impedances in a range of about 20 ohms to about 60 ohms may be achieved using various embodiments of ground plane height variation structures. Lower or higher inverter line characteristic impedances also may be achieved.

In FIGS. 3-5, 8A, and 9A, the cross section (along line X-X of FIG. 2) cuts through carrier amplifier die 232, inverter line 272, and substrate 210, 410, 510, 810, 910. More specifically, the cross section cuts through the first-die mounting zone 202, the inverter zone 204, and the output match zone 205 of various embodiments of substrates 210, 410, 510, 810, 910. In the cross-sectional view of FIG. 3, substrate 210 does not include a ground plane height variation structure within the inverter zone 204. Accordingly, a distance through the substrate 210 between the inverter line 272 and the system ground plane (or the bottom surface 214 of the substrate 200) substantially equals the thickness 350 of the substrate 210. In such a configuration, an "ungrounded portion" 360 of the substrate 210 underlying the inverter line 272 includes portions of all dielectric material layers 318-324 that make up the substrate 210. This ungrounded portion 360 of the substrate 210 may be substantially devoid of grounded conductive features (i.e., portions of conductive layers 308-314 and/or vias 317 that are coupled to the system ground plane).

In contrast with the substrate 210 of FIG. 3, FIGS. 4-9 illustrate substrates 410, 510, 810, 910 that include various embodiments of a ground plane height variation structure 420, 520, 720, 820, 920. Generally, a ground plane height variation structure includes one or more conductive features that are configured to provide an electrically conductive path between the bottom surface 214 of the substrate 410, 510, 810, 910 and an interior point or plane within the substrate 410, 510, 810, 910 that is located between the bottom and top surfaces 214, 212 of the substrate 410, 510, 810, 910. For example, a ground plane height variation structure may include one or more conductive features that extend from the bottom surface 214 of the substrate 410, 510, 810, 910 toward but not to the top surface 212 of the substrate 410, 510, 810, 910. In some embodiments, the "interior point or plane" to which a conductive feature may extend corresponds to an interface between adjacent dielectric material layers 318-324. More specifically, the one or more conductive features each may have a first end or surface that is substantially co-planar with the bottom surface 214, and a second end or surface that is substantially co-planar with an interface between adjacent dielectric material layers 318-324, or that is substantially co-planar with another plane between the top and bottom substrate surfaces 212, 214.

Figure 4:
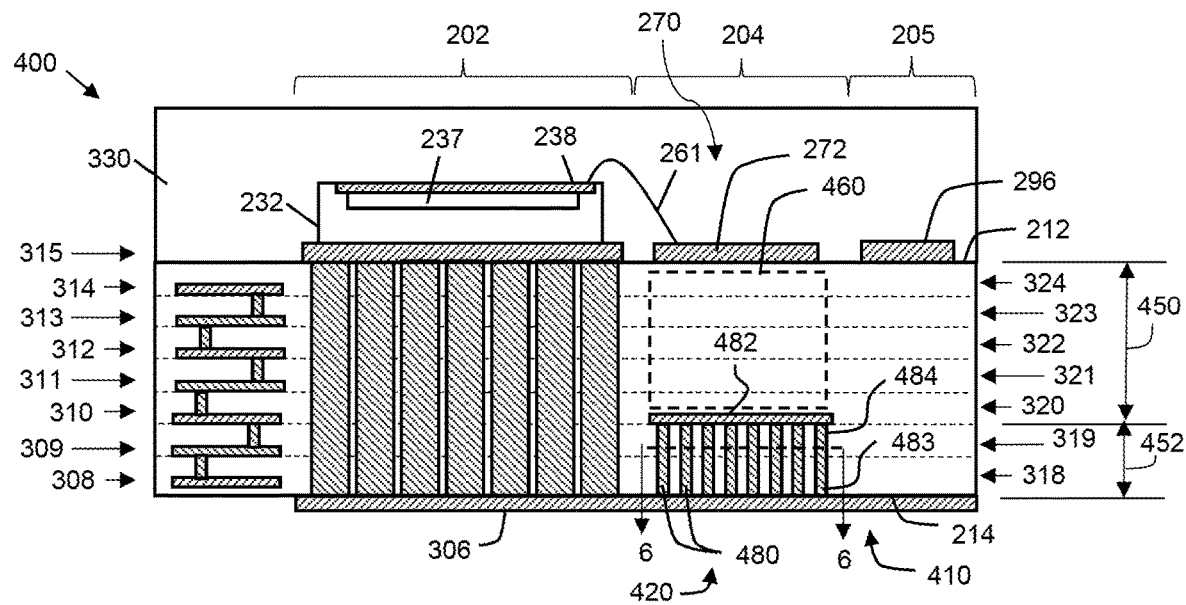
FIG. 4 is a cross-sectional, side view of a portion the module of FIG. 2 along line X-X, in accordance with an example embodiment.

Referring now to FIG. 4, an embodiment of module 400 includes substrate 410, a first die 238 with transistor 237 and transistor output terminal 238, a second die 258 (FIG. 2), an impedance inversion structure 270, and an output line 296, among other components. The impedance inversion structure 270 includes a series combination of first wirebonds 261, inverter line 272, and second wirebonds 263 (FIG. 2).

Module 400 differs from module 200 (FIG. 3) in that module 400 also includes a ground plane height variation structure 420 formed within substrate 410. More specifically, ground plane height variation structure 420 includes a plurality of conductive features 480 that extend from the bottom surface 214 of the substrate 410 toward but not to the top surface 212 of the substrate 410, and a conductive plane 482 embedded within the substrate 410 between the top and bottom surfaces 212, 214 of the substrate 410. Each of the conductive features 480 has a first end 483 that is substantially co-planar with or exposed at the bottom surface 214, and a second end 484 that is substantially co-planar with an interface between adjacent dielectric material layers 319 and 320. The conductive plane 482 may be formed from a portion of metal layer 310 at that interface, and the conductive plane 482 electrically connects the plurality of conductive features 480. The conductive plane 482 is considered an upper boundary of the ground plane height variation structure 420, and the ground plane height variation structure 420 provides an electrically conductive path (including layer 482 and vias 480) between the upper boundary of the structure 420 and the land surface 214 of the substrate 410.

The conductive features 480 may have any of various configurations. In the embodiment of FIG. 4, the conductive features 480 extend in a direction that is perpendicular to the bottom surface 214 of the substrate 410. In some embodiments, the conductive features 480 may include an array of conductive vias, each of which extends from the bottom surface 214 of the substrate 410 through one or more dielectric layers 318-323, terminating at an interior point within the substrate 410 (e.g., at the interface between dielectric material layers 319 and 320 in FIG. 4). For example, referring to FIG. 6, which is a cross-sectional view of the ground plane height variation structure 420 of FIG. 4 along line 6-6, the conductive features 480 may include an array of circular conductive vias formed in the substrate 410 within the inverter zone 204. As mentioned above, the conductive features 480 may be electrically coupled together with a conductive plane 482 (e.g., a patterned portion of layer 310, or some other layer), which also is formed within the inverter zone 204. Note that, in FIG. 6, the perimeter (footprint) of the conductive plane 482 is indicated with cross-hatching that is opposite in orientation from the cross-hatching of the vias 480, and the perimeter of the conductive plane 482 is indicated with a dashed box since the cross-section along line 6-6 does not cut through conductive plane 482. In alternate embodiments, the footprint within which the array of conductive features 480 and the conductive plane 482 are enclosed may be modified to more closely match the shape of the inverter line 272 (and to underlie the inverter line 272), rather than being shaped to encompass substantially the entire inverter zone 204. In still other alternate embodiments, the conductive plane 482 may be excluded from the ground plane height variation structure 420 altogether, and the structure 420 may include just the array of conductive features 480. In such an embodiment, the interior second ends 484 of the vias 480 correspond to the upper boundary of the ground plane height variation structure 420.

In any event, when the first ends 483 of the conductive features 480 are electrically coupled to the system ground reference (or plane), the ground plane height variation structure 420 functions to raise (physically elevate) the system ground plane to the height 452 of the conductive plane 482 (or to the height 452 of the second ends 484 of the conductive features 480). The "height" 452 of the ground plane variation structure 420 may be considered to be the length (between ends 483, 484) of the conductive features 480. In the embodiment of FIG. 4, this height 452 is less than half the total thickness (e.g., thickness 350) of the substrate 410 between top and bottom surfaces 212, 214, although the height could be equal to half or more than half, in other embodiments. More specifically, this height 452 extends to the interface between dielectric material layers 319 and 320. Accordingly, the thickness 450 of an ungrounded portion 460 of the substrate 410 underlying the inverter line 272 corresponds only to the cumulative thickness of dielectric material layers 320-324, rather than the thickness (e.g., thickness 350, FIG. 3) of the entire substrate 410. In other words, from the perspective of the inverter line 272, thickness 450 is the "effective height" of the substrate 410, which is substantially less than the full height (e.g., height 350) of the substrate 410. All other things being equal (e.g., the physical dimensions of the inverter line 272), this elevation of the system ground plane (or decrease in the height 450 of the ungrounded portion 460 of the substrate 410) results in a decrease in the characteristic impedance of the inverter line 272. It should be noted that the ground plane height variation structure 420 does not underlie all components or transmission lines, and thus the height of the system ground plane underlying other system components (e.g., underlying output line 296) is not affected by the ground plane height variation structure 420, in an embodiment. Accordingly, the characteristic impedances of those system components are not altered by the ground plane height variation structure 420. In various embodiments, the ground plane height variation structure 420 underlies less than 50 percent of the top surface 212 of the substrate 410. In further embodiments, the ground plane height variation structure 420 underlies less than 25 percent of the top surface 212, or less than 10 percent of the top surface.

Figure 5:
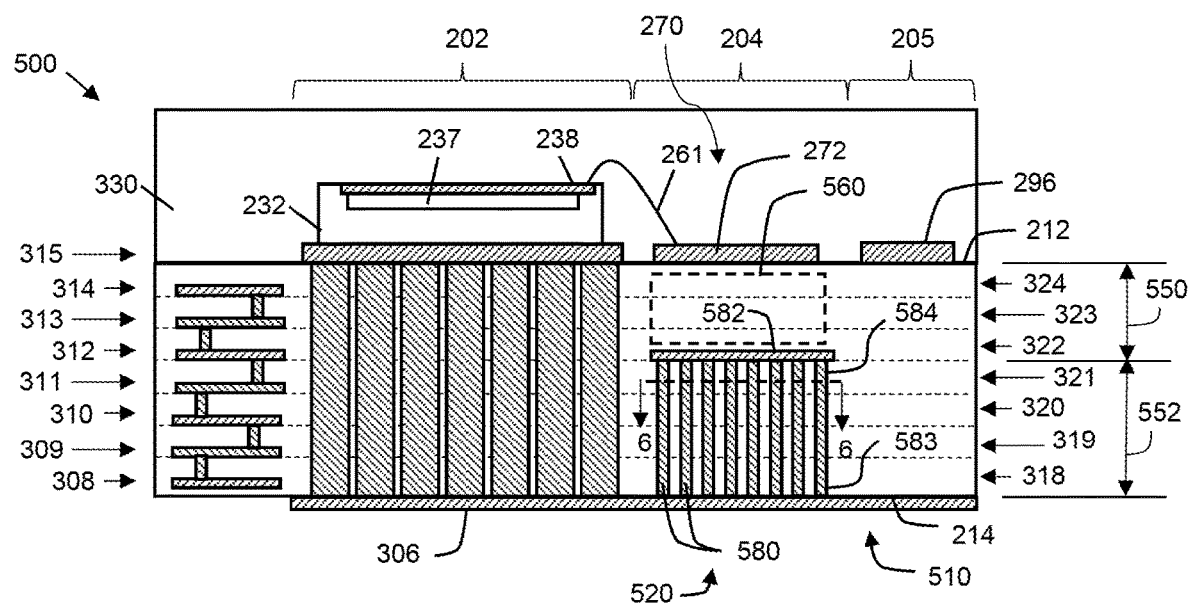
FIG. 5 is a cross-sectional, side view of a portion the module of FIG. 2 along line X-X, in accordance with yet another example embodiment.
Figure 6:
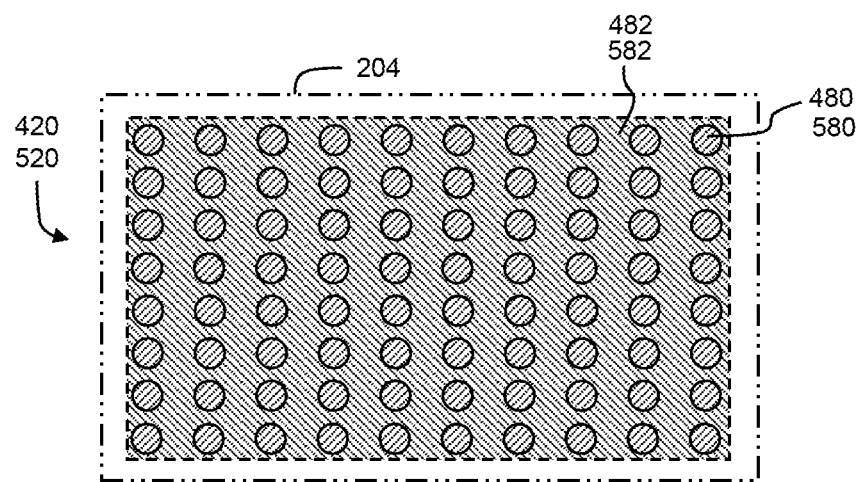
FIG. 6 is a cross-sectional, top view of a circular via array in the impedance inverter zone of FIGS. 4 and 5 along line 6-6, in accordance with an example embodiment.

Referring now to FIG. 5, another embodiment of a module 500 includes a substrate 510 with a higher ground plane height variation structure 520 than in the embodiment of FIG. 4. Similar to ground plane height variation structure 420, ground plane height variation structure 520 also includes a plurality of conductive features 580 that extend from the bottom surface 214 of the substrate 510 toward but not to the top surface 212 of the substrate 510, and a conductive plane 582 embedded within the substrate 510 between the top and bottom surfaces 212, 214 of the substrate 510. Again, the conductive features 580 may have any of a plurality of configurations (such as circular vias, as shown in FIG. 6), and both the conductive features 580 and the conductive plane 582 may be formed within the inverter zone 204.

Each of the conductive features 580 has a first end 583 that is substantially co-planar with or exposed at the bottom surface 214, and a second end 584 that is substantially co-planar with a plane that is interior to the substrate 510 (e.g., the interface between adjacent dielectric material layers 321 and 322, as shown). Once again, the lengths of the conductive features 580 defines the height 552 of the ground plane height variation structure 520, and the conductive plane 582 is considered an upper boundary of the ground plane height variation structure 520, and the ground plane height variation structure 520 provides a conductive path (including layer 582 and vias 580) between the upper boundary of the structure 520 and the land surface 214 of the substrate 510. In alternate embodiments, the conductive plane 582 may be excluded, and the second ends 584 of the vias 580 correspond to the upper boundary of the ground plane height variation structure 520.

In the embodiment of FIG. 5, this height 552 is more than half the total thickness (e.g., thickness 350) of the substrate 510 between top and bottom surfaces 212, 214. More specifically, this height 552 extends to the interface between dielectric material layers 321 and 322. Accordingly, the thickness 550 of an ungrounded portion 560 of the substrate 510 underlying the inverter line 272 (or the effective height of the substrate, from the perspective of the inverter line 272) corresponds to the cumulative thickness of dielectric material layers 322-324. Said another way, in module 500, the second ends 584 and the conductive plane 582 are physically closer to the inverter line 272 than in the module 400 of FIG. 4. Accordingly, all other things being equal (e.g., the physical dimensions of the inverter line 272), this further elevation of the system ground plane (or further decrease in the height 550 of the ungrounded portion 560 of the substrate 510) results in a further decrease in the characteristic impedance of the inverter line 272, when compared with the embodiment of FIG. 4.

Although FIGS. 4 and 5 depict two example embodiments of ground plane height variation structures 420, 520 that extend, respectively, to the interface between dielectric material layers 319 and 320 or to the interface between dielectric material layers 321 and 322, other embodiments may have ground plane height variation structures that extend to other interfaces between adjacent dielectric material layers (e.g., to the interface between adjacent layers 318 and 319, adjacent layers 320 and 321, adjacent layers 322 and 323, or adjacent layers 323 and 324). Other modules may have more or fewer dielectric layers, as well. Further still, other embodiments may have ground plane height variation structures that extend to points or planes that are between the interfaces between adjacent layers.

Although FIG. 6 depicts one possible configuration for an array of conductive features 480, 580 of a ground plane height variation structure, the conductive features and/or the assembly of conductive features may have other configurations, as well. More specifically, alternate embodiments of ground plane height variation structures may have more or fewer rows and/or columns of vias, may have staggered rows and/or columns of vias, may have more or less densely distributed vias, may have differently shaped vias (e.g., oval or rectangular), and/or may include conductive structures other than vias.

Figure 7:
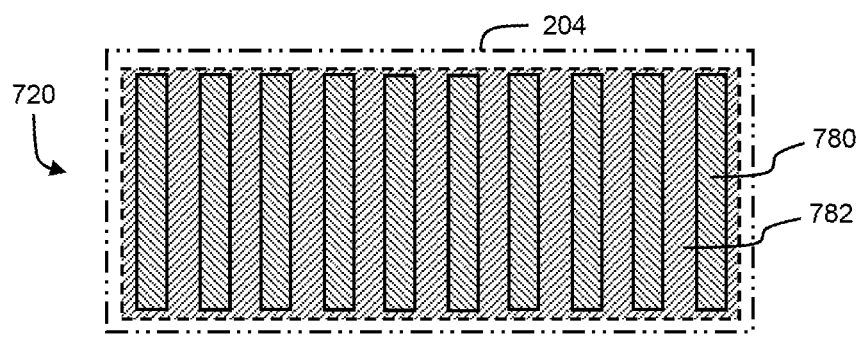
FIG. 7 is a cross-sectional, top view of a bar via array in the impedance inverter zone, in accordance with another example embodiment.

For example, referring to FIG. 7, another embodiment of a ground plane height variation structure 720, shown in top cross-sectional view, may include a conductive plane 782 and a plurality of conductive trenches 780 (e.g., similar to trenches 380, FIG. 3) that extend from the bottom surface of a substrate toward (but not to) the top surface of the substrate within the inverter zone 204. For example, the conductive trenches 780 may be filled with copper or another electrically conductive material, and dielectric material 780 of the substrate may separate the trenches 780. Although FIG. 7 depicts a particular number of trenches, each with substantially the same length (vertical dimension in FIG. 7), other embodiments may include more or fewer trenches, and/or trenches of various lengths.

In yet another alternate embodiment, a ground plane height variation structure may include a solid conductive structure underlying the inverter line 272. For example, FIG. 8, including FIGS. 8A and 8B, show top and side cross-sectional views, respectively, of another embodiment of a ground plane height variation structure 820 that is embedded within a cavity 812 in a multi-layer substrate 810. As indicated in the cross-sectional view of FIG. 8B, the cavity 812 and the ground plane height variation structure 820 are located within the impedance inverter zone 204, and thus underlie the inverter line 272. Although the ground plane height variation structure 820 is shown in FIG. 8B to have a rectangular cross-sectional shape, other embodiments may include a ground plane height variation structure with a different shape, including the shape of the inverter line 272.

The cavity 812 and the ground plane height variation structure 820 extend from the bottom surface 214 of the substrate 810 toward but not to the top surface 212 of the substrate 810, terminating at an interior point within the substrate 810 (e.g., near the interface between dielectric material layers 321 and 322 in FIG. 8A). Although the ground plane height variation structure 820 of FIG. 8 is shown to terminate near the interface between layers 321 and 322, the structure 820 could terminate at any lower or higher interface between adjacent dielectric material layers 318-324, or at a point between adjacent dielectric material layers 318-324. In any event, when the ground plane height variation structure 820 is electrically coupled to the system ground reference (or plane), the ground plane height variation structure 820 functions to raise the system ground plane to the height 852 of the ground plane height variation structure 820 (i.e., to the top surface 884 of the structure 820, which is considered the upper boundary of structure 820). Essentially, the ground plane height variation structure 820 provides a conductive path 8 between the upper boundary of the structure 820 and the land surface 214 of the substrate 810.

The ground plane height variation structure 820 includes a solid conductive structure defined by a bottom surface 882, a top surface 884, and sidewalls 886. The bottom surface 882 is substantially co-planar with or exposed at the bottom surface 214, and the top surface 884 is substantially co-planar with a plane that is interior to the substrate 810. The sidewalls 886 may contact sidewalls of the cavity 812. For example, the ground plane height variation structure 820 may include a conductive slug (e.g., a copper slug), that may be press-fit into the cavity 812, in an embodiment. In an alternate embodiment, the cavity 812 may be lined with a conductive layer (not illustrated), and a solid conductive structure may be inserted into the lined cavity 812 and soldered, adhered (with a conductive adhesive), brazed, or sintered to the conductive lining.

The height 852 of the ground plane height variation structure 820 is defined by the distance between the bottom surface 214 of the substrate 810 and the top surface 884 of the structure 820. In the embodiment of FIG. 8, this height 852 is more than half the total thickness (e.g., thickness 350) of the substrate 810 between top and bottom surfaces 212, 214. In other embodiments, the height 852 may be shorter or higher than that depicted in FIG. 8. In the illustrated embodiment, the thickness 850 of an ungrounded portion 860 of the substrate 810 underlying the inverter line 272 (or the effective height of the substrate, from the perspective of the inverter line 272) roughly corresponds to the cumulative thickness of dielectric material layers 322-324. Either way, all other things being equal (e.g., the physical dimensions of the inverter line 272), the elevation of the system ground plane provided by the ground plane height variation structure 820 results in a decrease in the characteristic impedance of the inverter line 272, when compared with the module 200 of FIG. 2.

In yet another alternate embodiment, a ground plane height variation structure may include a hollow conductive structure underlying the inverter line 272. For example, FIG. 9, including FIGS. 9A and 9B, show top and side cross-sectional views, respectively, of another embodiment of a ground plane height variation structure 920 that includes a conductive layer 982 disposed within a cavity 912 in a multi-layer substrate 910. The conductive layer 982 includes a conductive top layer 984 disposed on a top interior wall 913 of the cavity 912, and conductive side layers 986 disposed on interior sidewalls 914, 915 of the cavity 912. The top layer 984 is considered the upper boundary of the ground plane height variation structure 920, and the ground plane height variation structure 920 provides a conductive path (including layers 984, 986) between the upper boundary of the structure 920 and the land surface 214 of the substrate 910. As indicated in the cross-sectional view of FIG. 9B, the cavity 912 and the ground plane height variation structure 920 are located within the impedance inverter zone 204, and thus underlie the inverter line 272. Although the ground plane height variation structure 920 is shown in FIG. 9B to have a rectangular cross-sectional shape, other embodiments may include a ground plane height variation structure with a different shape, including the shape of the inverter line 272.

The cavity 912 and the ground plane height variation structure 920 extend from the bottom surface 214 of the substrate 910 toward but not to the top surface 212 of the substrate 910, terminating at an interior point within the substrate 910 (e.g., near the interface between dielectric material layers 321 and 322 in FIG. 9A). Although the ground plane height variation structure 920 of FIG. 9 is shown to terminate near the interface between layers 321 and 322, the structure 920 could terminate at any lower or higher interface between adjacent dielectric material layers 318-324, or at a point between adjacent dielectric material layers 318-324. In any event, when the ground plane height variation structure 920 is electrically coupled to the system ground reference (or plane), the ground plane height variation structure 920 functions to raise the system ground plane to the height 952 of the ground plane height variation structure 920 (i.e., to the top layer 984 of the structure 920).

The ground plane height variation structure 920 includes a top layer 984 disposed on the interior top surface of the cavity 912, and side layers 986 disposed on the interior sidewalls of the cavity 912. For example, the ground plane height variation structure 920 may include one or more conductive layers that are deposited onto the interior surfaces of the cavity 912, in an embodiment. The top and side layers 984, 986 are electrically connected to each other. Further, the side layers 986 extend from the interior top surface of the cavity 912 to the bottom surface 214 of the substrate 910. As shown in FIG. 9, the top layer 984 is substantially co-planar with a plane that is interior to the substrate 910.

The height 952 of the ground plane height variation structure 920 is defined by the distance between the bottom surface 214 of the substrate 910 and the top layer 984 of the structure 920. In the embodiment of FIG. 9, this height 952 is more than half the total thickness (e.g., thickness 350) of the substrate 910 between top and bottom surfaces 212, 214. In other embodiments, the height 952 may be shorter or higher than that depicted in FIG. 9. In the illustrated embodiment, the thickness 950 of an ungrounded portion 960 of the substrate 910 underlying the inverter line 272 (or the effective height of the substrate, from the perspective of the inverter line 272) roughly corresponds to the cumulative thickness of dielectric material layers 322-324. Either way, all other things being equal (e.g., the physical dimensions of the inverter line 272), the elevation of the system ground plane provided by the ground plane height variation structure 920 results in a decrease in the characteristic impedance of the inverter line 272, when compared with the module 200 of FIG. 2.

Different Doherty amplifier power level designs may have different required characteristic impedances for their phase shift and impedance inversion structures (e.g., structure 170, FIG. 1), and thus different required characteristic impedances for the transmission lines (e.g., inverter line 272, FIGS. 2-5, 8, 9) included within those structures. With a given substrate having a specific dielectric constant and substrate height (i.e., distance through the substrate between the inverter line and the system ground plane), for example, a relatively low power Doherty design (e.g., peak power of about 15 watts) may have a certain required characteristic impedance (e.g., about 50 ohms), and a relatively high power level Doherty design (e.g., peak power of about 35 watts) may have a significantly lower required characteristic impedance (e.g., about 25 ohms). In a conventional system, to achieve the different characteristic impedances, the width of the inverter line for the relatively low power Doherty design may be made significantly narrower than the width of the inverter line for the relatively high power Doherty design. For example, given the above example and a substrate with a defined dielectric constant and thickness, the width of the inverter line for the relatively low power design may be about 300-400 microns to achieve a 50 ohm characteristic impedance, whereas the width of the inverter line for the relatively high power design may be about 1200-1600 microns to achieve a 25 ohm characteristic impedance. Using conventional techniques, and given that the inverter line may be required (or desired) to fit within a specific area (e.g., within the impedance inverter zone 204, FIG. 2), the substrate characteristics (e.g., dielectric constant and thickness) impose a limit on the inverter line width, and thus on the power level of the amplifier design.

Embodiments of the inventive subject matter enable the characteristic impedance of a given inverter line to be reduced, without requiring the inverter line width to be increased. More specifically, the inclusion of an embodiment of a ground plane height variation structure (e.g., structure 420, 520, 720, 820, 920, FIGS. 4-9) within a substrate (e.g., substrate 410, 510, 810, 910, FIGS. 4-9) enables the characteristic impedance of a given inverter line to be decreased to a desired value without increasing the inverter line width. Accordingly, the inclusion of an embodiment of a ground plane height variation structure enables an inverter line for a relatively high power amplifier to fit within a pre-defined area (e.g., within impedance inverter zone 204, FIG. 2) that may be too small to accommodate a wider inverter line coupled to a conventional substrate (i.e., a substrate without a ground plane height variation structure). Thus, embodiments of the inventive subject matter enable relatively compact amplifier module designs.

Figure 10:
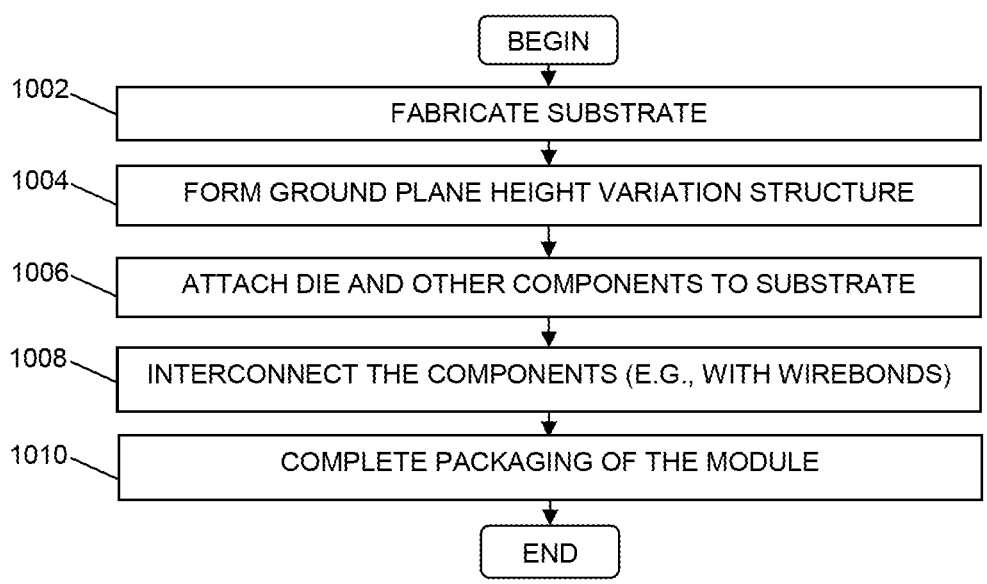
FIG. 10 is a flowchart of a method for fabricating a module with a ground plane height variation structure, in accordance with an example embodiment.

FIG. 10 is a flowchart of a method for fabricating a module (e.g., Doherty amplifier module 400, 500, 800, 900, FIGS. 4-9) with a ground plane height variation structure (e.g., structure 420, 520, 720, 820, 920, FIGS. 4-9), in accordance with an example embodiment.

The method begins, in block 1002, by fabricating a substrate (e.g., substrate 410, 510, 810, 910, FIGS. 2, 4, 5, 8, 9), which includes a plurality of conductive features (e.g., landing pads, contacts, conductive traces, and conductive vias) arranged to provide desired electrical connectivity to subsequently attached discrete die and components. As discussed previously, a plurality of non-overlapping zones (e.g., zones 201-205, FIG. 2) may be defined at the mounting surface (e.g., surface 212, FIG. 2) of the substrate. Within die mounting zones (e.g., zones 202, 203, FIG. 2), the substrate may include conductive heat-sink features (e.g., conductive trenches 380, FIG. 3). In addition, in an embodiment, the substrate may include one or more transmission line elements (e.g., phase shift and impedance inversion element 272, FIG. 2), with physical and electrical lengths configured as described in detail above.

In block 1004, either during fabrication of the substrate or afterwards, a ground plane height variation structure (e.g., structure 420, 520, 720, 820, 920, FIGS. 4-9) is formed within the substrate. For example, when the ground plane height variation structure is configured to include an embedded conductive plane (e.g., conductive plane 482, 582, 782) and one or more vertical conductive features (e.g., conductive vias or trenches 480, 580, 780), the conductive plane and the conductive features may be formed using a multi-step process during the process of assembling the substrate. For example, referring to the ground plane height variation structure 420 (FIG. 4), the conductive plane 482 may be formed by depositing conductive layer 310 onto dielectric layer 320, and patterning the conductive layer 310 to form the conductive plane 482. Dielectric layers 319 and 318 may thereafter be attached (e.g., laminated) to dielectric layer 320 over the conductive plane 482. Dielectric layers 319 and 318 each may have aligned via openings, and after laminating dielectric layers 318-320 together, the aligned via openings may be plated and/or filled with conductive material to form conductive vias 480. Alternatively, the via openings may be formed and filled after laminating dielectric layers 318-320 together. In the embodiment depicted in FIG. 7, the conductive plane 782 and conductive trenches 780 may be formed in similar manners.

Alternatively, a solid or hollow ground plane height variation structure (e.g., structures 820, 920, FIGS. 8, 9) may be inserted into or formed within a cavity (e.g., cavity 812, 912, FIGS. 8, 9). In such embodiments, the cavity may be formed during assembly of the substrate (e.g., the various dielectric layers may include aligned openings prior to lamination), or the cavity may be formed after assembly of the substrate. Either way, according to some embodiments, a solid ground plane height variation structure (e.g., structure 820, FIG. 8) may be press-fit or otherwise attached within the cavity (e.g., cavity 812, FIG. 8), or alternatively the solid ground plane height variation structure may be formed within the cavity (e.g., by plating the interior cavity walls and filling the cavity with a conductive material). Conversely, a hollow ground plane height variation structure (e.g., structure 920, FIG. 9) may be formed by plating, sputtering, or otherwise depositing one or more conductive layers onto the interior cavity walls.

Additional processes are performed to complete the amplifier module. For example, in block 1006, first and second amplifier die (e.g., carrier and peaking amplifier die 232, 252, FIG. 2) are attached to the mounting surface of the substrate in the die mounting zones, and other discrete components also are attached to the mounting surface of the substrate. In block 1008, the various components are electrically connected together with wirebonds (e.g., including wirebonds 261, 263, FIGS. 2-5, 8, 9) and/or other conductive coupling means. Finally, in block 1010, the various die and components overlying the mounting surface of the substrate are encapsulated (e.g., with encapsulant material 330, FIG. 3), or otherwise contained (e.g., in an air cavity package configuration) to complete the module.

An embodiment of a module includes a substrate, a transmission line, and a ground plane height variation structure. The substrate is formed from a plurality of dielectric material layers, and has a mounting surface and a second surface opposite the mounting surface. A plurality of non-overlapping zones is defined at the mounting surface. The transmission line is coupled to the substrate and is located within a first zone of the plurality of non-overlapping zones. The ground plane height variation structure extends from the second surface into the substrate within the first zone. The ground plane height variation structure underlies the transmission line, a portion of the substrate is present between the upper boundary and the transmission line, and the ground plane height variation structure includes a conductive path between an upper boundary of the ground plane height variation structure and the second surface.

An embodiment of a power amplifier module includes a substrate, first and second power amplifier die, a transmission line, and a ground plane height variation structure. The substrate is formed from a plurality of dielectric material layers, and has a mounting surface and a second surface opposite the mounting surface. A plurality of non-overlapping zones is defined at the mounting surface. The first power transistor die is coupled to the mounting surface in a first zone of the plurality of non-overlapping zones, and the first power transistor die includes a first transistor integrated within the first power transistor die, where the first transistor includes a first output terminal. The second power transistor die is coupled to the mounting surface in a second zone of the plurality of non-overlapping zones, and the second power transistor die includes a second transistor integrated within the second power transistor die, where the second transistor includes a second output terminal. The transmission line is coupled to the substrate and is located within a third zone of the plurality of non-overlapping zones. A first end of the transmission line is coupled to the first output terminal, and a second end of the transmission line is coupled to the second output terminal. The ground plane height variation structure extends from the second surface of the substrate into the substrate within the third zone. The ground plane height variation structure underlies the transmission line, and the ground plane height variation structure includes a conductive path between an upper boundary of the ground plane height variation structure and the second surface. A portion of the substrate is present between the upper boundary and the transmission line.

An embodiment of a Doherty amplifier includes a substrate, a carrier amplifier die, a peaking amplifier die, a phase shift and impedance inversion structure, and a ground plane height variation structure. The substrate is formed from a plurality of dielectric material layers, and has a mounting surface and a second surface opposite the mounting surface. A plurality of non-overlapping zones is defined at the mounting surface. The carrier amplifier die is coupled to the mounting surface, and the carrier amplifier die includes a first transistor with a first drain terminal. The peaking amplifier die also is coupled to the mounting surface, and the peaking amplifier die includes a second transistor with a second drain terminal. The phase shift and impedance inversion structure is connected between the first drain terminal and the second drain terminal, and the phase shift and impedance inversion structure includes a transmission line coupled to the substrate and located within a first zone of the plurality of non-overlapping zones. A first end of the first transmission line is coupled to the first drain terminal, and a second end of the first transmission line is coupled to the second drain terminal. The ground plane height variation structure extends from the second surface of the substrate into the substrate within the first zone. The ground plane height variation structure underlies the transmission line, and the ground plane height variation structure includes a conductive path between an upper boundary of the ground plane height variation structure and the second surface. A portion of the substrate is present between the upper boundary and the first transmission line.

The preceding detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A module comprising:
    a substrate formed from a plurality of dielectric material layers, and having a mounting surface and a second surface opposite the mounting surface, wherein a plurality of non-overlapping zones is defined at the mounting surface;
    first and second power transistors coupled to the substrate;
    a transmission line coupled to the substrate and located within a first zone of the plurality of non-overlapping zones, wherein the transmission line is electrically coupled between the first and second power transistors; and
    a ground plane height variation structure extending from the second surface into the substrate within the first zone, wherein the ground plane height variation structure underlies the transmission line, a portion of the substrate is present between an upper boundary of the ground plane height variation structure and the transmission line, and the ground plane height variation structure includes a conductive path between the upper boundary of the ground plane height variation structure and the second surface.

2. The module of claim 1, wherein the ground plane height variation structure comprises:
    a plurality of conductive vias within the first zone and extending from the second surface into the substrate.

3. The module of claim 2, wherein the ground plane height variation structure further comprises:
    a conductive plane embedded within the substrate and defining the upper boundary, wherein the conductive vias have first ends that are co-planar with the second surface, and second ends connected to the conductive plane.

4. The module of claim 1, wherein the ground plane height variation structure comprises:
    a plurality of conductive trenches within the first zone and extending from the second surface into the substrate.

5. The module of claim 4, wherein the ground plane height variation structure further comprises:
    a conductive plane embedded within the substrate and defining the upper boundary, wherein the conductive trenches have first ends that are co-planar with the second surface, and second ends connected to the conductive plane.

6. The module of claim 1, wherein the ground plane height variation structure comprises:
    a solid conductive structure disposed in a cavity within the substrate.

7. The module of claim 1, wherein the ground plane height variation structure comprises:
    a hollow conductive structure that includes a first conductive layer disposed on a top interior wall of a cavity within the substrate, and a second conductive layer disposed on an interior sidewall of the cavity.

8. The module of claim 1, wherein a height of the ground plane variation structure is at least half of a total thickness of the substrate.

9. The module of claim 1, wherein a height of the ground plane variation structure is more than half of a total thickness of the substrate.

10. A power amplifier module comprising:
    a substrate formed from a plurality of dielectric material layers, and having a mounting surface and a second surface opposite the mounting surface, wherein a plurality of non-overlapping zones is defined at the mounting surface;
    a first power transistor die coupled to the mounting surface in a first zone of the plurality of non-overlapping zones, wherein the first power transistor die includes a first transistor integrated within the first power transistor die, and wherein the first transistor includes a first output terminal;
    a second power transistor die coupled to the mounting surface in a second zone of the plurality of non-overlapping zones, wherein the second power transistor die includes a second transistor integrated within the second power transistor die, and wherein the second transistor includes a second output terminal;
    a first transmission line coupled to the substrate and located within a third zone of the plurality of non-overlapping zones, wherein a first end of the first transmission line is coupled to the first output terminal, and a second end of the first transmission line is coupled to the second output terminal; and
    a ground plane height variation structure extending from the second surface of the substrate into the substrate within the third zone, wherein the ground plane height variation structure underlies the first transmission line, the ground plane height variation structure includes a conductive path between an upper boundary of the ground plane height variation structure and the second surface, and a portion of the substrate is present between the upper boundary and the first transmission line.

11. The amplifier module of claim 10, further comprising:
a second transmission line coupled to the substrate and located within a fourth zone of the plurality of non-overlapping zones, wherein the ground plane height variation structure does not underlie the second transmission line.

12. The amplifier module of claim 10, further comprising:
first wirebonds connected between the first output terminal and the first end of the first transmission line; and
second wirebonds connected between the second output terminal and the second end of the first transmission line, and
wherein the first transmission line, the first wirebonds, and the second wirebonds form portions of a phase delay and impedance inversion element, and wherein the phase shift and impedance inversion element has an electrical length that is less than 90 degrees.

13. The amplifier module of claim 10, wherein the ground plane height variation structure comprises:
a plurality of conductive vias within the third zone and extending from the second surface into the substrate; and
a conductive plane embedded within the substrate and defining the upper boundary, wherein the conductive vias have first ends that are co-planar with the second surface, and second ends connected to the conductive plane.

14. The amplifier module of claim 10, wherein the ground plane height variation structure comprises:
a plurality of conductive trenches within the third zone and extending from the second surface into the substrate; and
a conductive plane embedded within the substrate and defining the upper boundary, wherein the conductive trenches have first ends that are co-planar with the second surface, and second ends connected to the conductive plane.

15. The amplifier module of claim 10, wherein the ground plane height variation structure comprises:
a solid conductive structure disposed in a cavity within the substrate.

16. The amplifier module of claim 10, wherein the ground plane height variation structure comprises:
a hollow conductive structure that includes a first conductive layer disposed on a top interior wall of a cavity within the substrate, and a second conductive layer disposed on an interior sidewall of the cavity.

17. The amplifier module of claim 10, wherein the first power transistor die is a carrier amplifier die of a Doherty power amplifier, and the second power transistor die is a peaking amplifier die of a Doherty power amplifier.

18. A Doherty amplifier comprising:
a substrate formed from a plurality of dielectric material layers, and having a mounting surface and a second surface opposite the mounting surface, wherein a plurality of non-overlapping zones is defined at the mounting surface;
a carrier amplifier die coupled to the mounting surface, wherein the carrier amplifier die includes a first transistor with a first drain terminal;
a peaking amplifier die coupled to the mounting surface, wherein the peaking amplifier die includes a second transistor with a second drain terminal;
a phase shift and impedance inversion structure connected between the first drain terminal and the second drain terminal, wherein the phase shift and impedance inversion structure includes a first transmission line coupled to the substrate and located within a first zone of the plurality of non-overlapping zones, wherein a first end of the first transmission line is coupled to the first drain terminal, and a second end of the first transmission line is coupled to the second drain terminal; and
a ground plane height variation structure extending from the second surface of the substrate into the substrate within the first zone, wherein the ground plane height variation structure underlies the first transmission line, the ground plane height variation structure includes a conductive path between an upper boundary of the ground plane height variation structure and the second surface, and a portion of the substrate is present between the upper boundary and the first transmission line.

19. The Doherty amplifier of claim 18, wherein the ground plane height variation structure comprises:
a plurality of vertical conductive features within the first zone and extending from the second surface into the substrate; and
a conductive plane embedded within the substrate and defining the upper boundary, wherein the vertical conductive features have first ends that are co-planar with the second surface, and second ends connected to the conductive plane.

20. The Doherty amplifier of claim 18, wherein the ground plane height variation structure comprises:
a solid conductive structure disposed in a cavity within the substrate.

21. The Doherty amplifier of claim 18, wherein the ground plane height variation structure comprises:
a hollow conductive structure that includes a first conductive layer disposed on a top interior wall of a cavity within the substrate, and a second conductive layer disposed on an interior sidewall of the cavity.

* * * * *